(12) United States Patent
Paidimarri et al.

(10) Patent No.: US 11,843,361 B2
(45) Date of Patent: Dec. 12, 2023

(54) LO LEAKAGE SUPPRESSION IN FREQUENCY CONVERSION CIRCUITS

(71) Applicant: International Business Machines Corporation, Armonk, NY (US)

(72) Inventors: Arun Paidimarri, White Plains, NY (US); Bodhisatwa Sadhu, Peekskill, NY (US); Wooram Lee, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 17/501,088

(22) Filed: Oct. 14, 2021

(65) Prior Publication Data

US 2022/0231668 A1 Jul. 21, 2022

Related U.S. Application Data

(60) Provisional application No. 63/137,917, filed on Jan. 15, 2021.

(51) Int. Cl.
*H03H 11/32* (2006.01)
*H03D 7/14* (2006.01)
*H03B 5/12* (2006.01)

(52) U.S. Cl.
CPC .......... *H03H 11/32* (2013.01); *H03B 5/1209* (2013.01); *H03B 5/1228* (2013.01);
(Continued)

(58) Field of Classification Search
CPC .. H03D 7/1458; H03D 7/1433; H03D 7/1425; H03D 7/14; H03D 7/1441; H03D 7/1466; H03D 3/008; H03D 3/009
See application file for complete search history.

(56) References Cited

U.S. PATENT DOCUMENTS 4,355,420 A  10/1982 Ishihara
5,862,466 A   1/1999 Erickson
(Continued)

FOREIGN PATENT DOCUMENTS

CN   106385270 A   2/2017
EP     2458729 A1   5/2012
(Continued)

OTHER PUBLICATIONS

Jahn, et al., "DC-Offset Compensation Concept for Monostatic FMCW Radar Transceivers," Published Sep. 2010. 3 pages. In IEEE Microwave and Wireless Components Letters, vol. 20, No. 9, pp. 525-527, doi: 10.1109/LMWC.2010.2056359.
(Continued)

*Primary Examiner* — Diana J. Cheng
(74) *Attorney, Agent, or Firm* — Haley J. McClory

(57) ABSTRACT

A processor may calibrate a first actuator electrically coupled to a transconductance stage of the frequency conversion circuit. The transconductance stage may be configured to receive a differential signal input. Calibrating a first actuator may adjust a first basis vector associated with a differential direct current (DC) output of the transconductance stage. A processor may calibrate a second actuator electrically coupled to receive the differential current output of the transconductance stage and electrically coupled to a set of commutating devices of the frequency conversion circuit. The commutating devices may be configured to receive differential LO inputs. Calibrating a second actuator may adjust a second basis vector associated with a differential impedance of the set of commutating devices. A processor may offset responsive to adjusting the first basis vector and the second basis vector, the first leakage basis vector and second leakage basis vector of the LO leakage signal.

23 Claims, 17 Drawing Sheets

(52) U.S. Cl.
CPC ..... *H03D 7/1441* (2013.01); *H03D 2200/009* (2013.01); *H03D 2200/0023* (2013.01)

(56) References Cited

U.S. PATENT DOCUMENTS

| | | | |
|---|---|---|---|
| 6,154,641 | A | 11/2000 | Zhang |
| 6,970,689 | B2 | 11/2005 | Khorram |
| 7,259,716 | B1 | 8/2007 | Dubbert |
| 7,792,501 | B2 | 9/2010 | Ahn |
| 8,536,926 | B2 | 9/2013 | Chen |
| 10,778,148 | B1 * | 9/2020 | Ali ................ H03D 7/1458 |
| 2003/0134611 | A1 | 7/2003 | Park |
| 2020/0119693 | A1 | 4/2020 | Ezz |

FOREIGN PATENT DOCUMENTS

| | | |
|---|---|---|
| WO | 2018121111 A1 | 7/2018 |
| WO | 2019125237 A1 | 6/2019 |

OTHER PUBLICATIONS

Jayasuriya, et al., "A baseband technique for automated LO leakage suppression achieving < —80dBm in wideband passive mixer-first receivers," Published in 2014. 4 pages. In Proceedings of the IEEE 2014 Custom Integrated Circuits Conference, San Jose, CA, pp. 1-4, doi: 10.1109/CICC.2014.6946014.

Lee, et al., "Fully Integrated 94-GHZ Dual-Polarized TX and RX Phased Array Chipset in SiGe BiCMOS Operating up to 105 °C," Published Sep. 2018. 20 pages. In IEEE Journal of Solid-State Circuits, vol. 53, No. 9, pp. 2512-2531, doi: 10.1109/JSSC.2018.2856254.

Mell, et al., "The NIST Definition of Cloud Computing," Recommendations of the National Institute of Standards and Technology, U.S. Department of Commerce, Special Publication 800-145, Sep. 2011, 7 pgs.

Paidimarri, et al., "LO Leakage Suppression in Frequency Conversion Circuits." U.S. Appl. No. 63/137,917, filed Jan. 15, 2021.

Pang, et al., "24.9 A 128-QAM 60GHz CMOS transceiver for IEEE802.11ay with calibration of LO feedthrough and I/Q imbalance," Published Feb. 8, 2017. 3 pages. In 2017 IEEE International Solid-State Circuits Conference (ISSCC), San Francisco, CA, pp. 424-425, doi: 10.1109/ISSCC.2017.7870442.

Praveen, et al., "An Automatic LO Leakage Calibration Method for Class-AB Power Mixer Based RF Transmitters," Published in 2018. 5 pages. In 2018 IEEE International Symposium on Circuits and Systems (ISCAS), Florence, pp. 1-5, doi: 10.1109/ISCAS.2018.8351518.

Wu, et al., "A passive-mixer-first receiver with LO leakage suppression, 2.6dB NF, >15dBm wide-band IIP3, 66dB IRR supporting non-contiguous carrier aggregation." Published in 2015. 4 pages. In 2015 IEEE Radio Frequency Integrated Circuits Symposium (RFIC), Phoenix, AZ, pp. 155-158, doi: 10.1109/RFIC.2015.7337728.

Yamada, et al., "Cancellation techniques for LO leakage and Dc offset in direct conversion systems," Published in 2008. 4 pages. In 2008 IEEE MTT-S International Microwave Symposium Digest, Atlanta, GA, pp. 1191-1194, doi: 10.1109/MWSYM.2008.4633271.

\* cited by examiner

LO LEAKAGE SUPPRESSION IN FREQUENCY CONVERSION CIRCUITS

BACKGROUND

Aspects of the present disclosure relate generally to the field of frequency conversion, and, more particularly to suppressing local oscillation (LO) leakage that may occur in a frequency conversion circuit. While frequency conversion circuits have traditionally used LO input signals to aid in the frequency conversion process, often this LO input signal can result in a parasitic signal that can leak into the output signal of the circuit. This LO leakage can cause distortion in the output signal and, in some situations, fail to comply with Federal Communication Commission (FCC) spurious emission requirements. Current LO leakage solutions often require the use of additional circuitry (e.g., additional mixers or complex mixer architectures) to mitigate the resulting LO distortion in the output signal. Unfortunately, while such additions may be sufficient, additional circuitry often takes up much needed area on the chip and results in additional power consumption. In addition, in some implementations, such additional circuitry has the potential to create additional parasitic signals that may further negatively affect the output signal.

As such, there is a continued desire to suppress and/or eliminate LO leakage in such a way as to reduce the need for additional circuitry (e.g., extra mixer configurations) while also ensuring the output signal is not distorted.

SUMMARY

A first aspect of the present disclosure provides a frequency conversion circuit configured to suppress a local oscillator (LO) leakage signal having a first leakage basis vector and a second leakage basis vector, the frequency conversion circuit, including: a first actuator electrically coupled to a transconductance stage of the frequency conversion circuit, the transconductance stage configured to receive a differential signal input, wherein the first actuator is configured to adjust a first basis vector associated with a differential output of the transconductance stage to, at least partially, offset the first leakage basis vector of the LO leakage signal, and a second actuator electrically coupled to the differential current output of the transconductance stage and electrically coupled to a set of commutating devices of the frequency conversion circuit, the commutating devices configured to receive differential LO inputs, wherein the second actuator is configured to adjust a second basis vector associated with a differential impedance of the set of commutating devices to, at least partially, offset the second leakage basis vector of the LO leakage signal.

A second aspect of the present disclosure provides a method to suppress a local oscillator (LO) leakage signal having a first leakage basis vector and a second leakage basis vector in a frequency conversion circuit, including: calibrating a first actuator electrically coupled to a transconductance stage of the frequency conversion circuit, the transconductance stage configured to receive a differential signal input, wherein calibrating a first actuator adjusts a first basis vector associated with a differential direct current (DC) output of the transconductance stage, calibrating a second actuator electrically coupled to receive the differential current output of the transconductance stage and electrically coupled to a set of commutating devices of the frequency conversion circuit, the commutating devices configured to receive differential LO inputs, wherein calibrating a second actuator adjusts a second basis vector associated with a differential impedance of the set of commutating devices, and offsetting at least partially, responsive to adjusting the first basis vector and the second basis vector, the first leakage basis vector and second leakage basis vector of the LO leakage signal.

A third aspect of the present disclosure provides a system for offsetting a local oscillator (LO) leakage signal, including: a frequency conversion circuit configured to receive a differential signal input and a differential LO input, wherein the frequency conversion circuit configures the differential signal input and the differential LO input to generate the mixed output having a LO leakage signal and a desired signal, the frequency conversion circuit further including: a first actuator configured within the frequency conversion circuit, wherein the first actuator is configured to adjust a first basis vector of the frequency conversion circuit, to, at least partially, offset the first leakage basis vector of the LO leakage signal, and a second actuator configured within the frequency conversion circuit, wherein the second actuator is configured to adjust a second basis vector of the frequency conversion circuit to, at least partially, offset the second leakage basis vector of the LO leakage signal, a detector coupled to measure the first leakage basis vector and the second leakage basis vector of the frequency conversion circuit, and a calibration module electrically coupled to receive the first leakage basis vector and the second leakage basis vector of the LO leakage signal measured by the detector, wherein the calibration module is electrically coupled to calibrate the first actuator and the second actuator to offset the first leakage basis vector and the second leakage basis vector, respectively.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
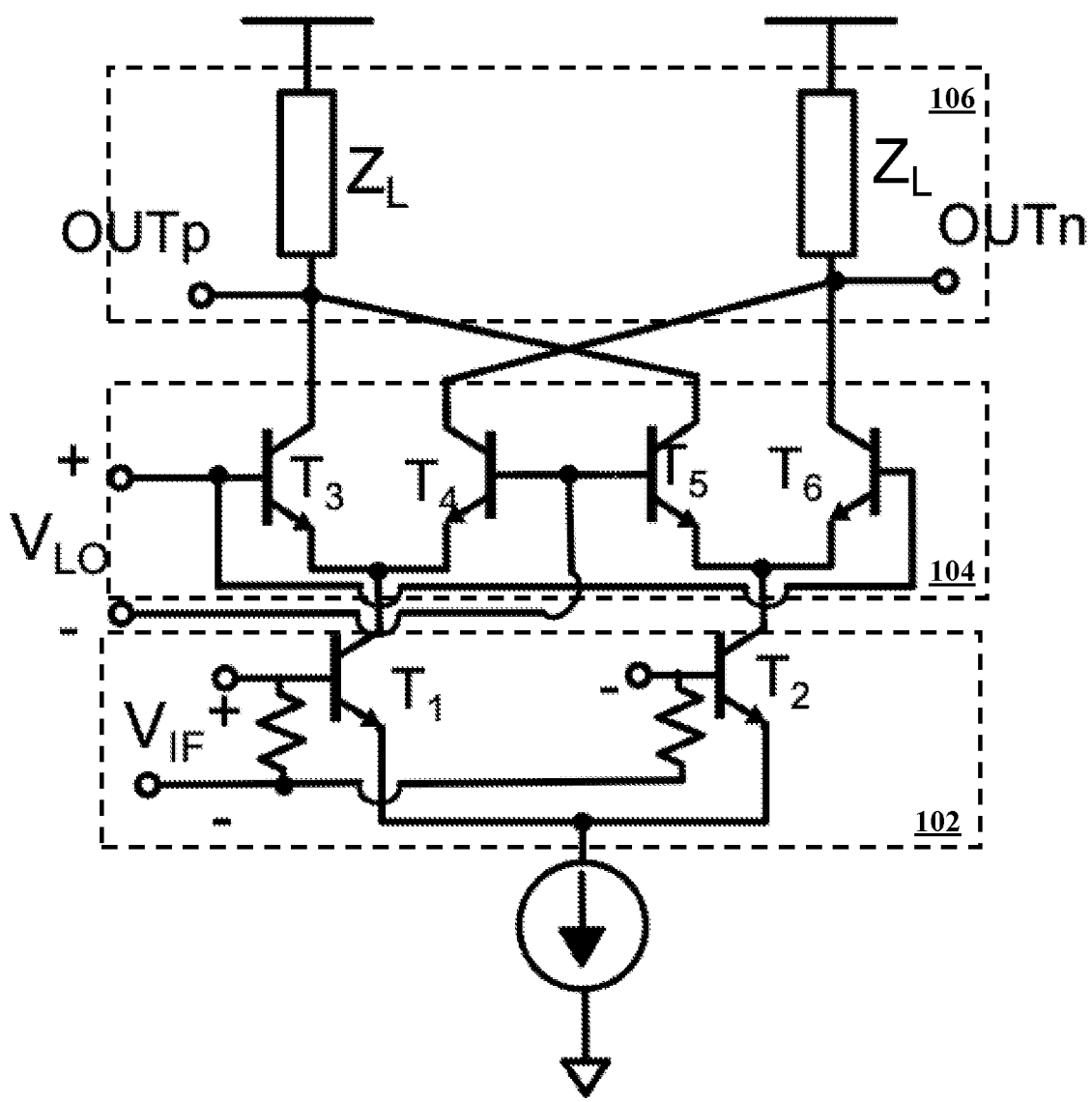
FIG. 1 depicts a schematic view of a conventional double sideband mixer circuit structure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of frequency conversion, and more particularly to suppressing local oscillation (LO) leakage that may occur in a such circuits. While the present disclosure is not necessarily limited to such applications, various aspects of the disclosure may be appreciated through a discussion of various examples using this context.

Frequency conversion circuits are commonly used in wireless network systems to perform either up-conversion or down-conversion frequency changes in a signal of interest (e.g., radio frequency (RF) and/or intermediate frequency (IF)). Frequency conversion circuits generally include one or more mixers that process (e.g., multiplying signals or performing non-linear mixing) particular signals together to generate new frequencies. While traditional frequency conversion circuits are useful, this usefulness is often limited by parasitic contamination of the output signal. One common source of parasitic contamination arises from leakage form the LO signal associated with the mixer. Such parasitic contamination represented in the output signal can affect the readability of data embedded in the signal, cause failure in meeting spectral mask(s), and can result in failure of signal transmission or reception.

Turning to FIG. 1, a schematic view of a conventional double-sideband mixer often used for frequency conversion is depicted. In these conventional circuits a particular signal input, $V_{IF}+$ and $V_{IF}-$ is received at the base of transistors $T_1$ and $T_2$ respectively. Transistors $T_1$ and $T_2$ together comprise transconductance stage 102 of mixer 100. Transistors $T_3$ and $T_6$ are configured to receive the $LO_0$ signal (e.g., $V_{LO}+$) at their respective bases and $T_4$ and $T_5$ are configured to receive $LO_{180}$ (e.g., $V_{LO}-$) at their respective bases. Transistors $T_3$, $T_4$, $T_5$, and $T_6$ comprise commutating devices 104 of mixer 100. Impedance devices, such as those represented by $Z_L$, and Output signals, $Out_P$ and $Out_N$, comprise output/load devices 106. In an ideal configuration of mixer circuit 100, a particular signal input (e.g., an input signal carrying data) is mixed (e.g., multiplied) together to form new sinusoidal signals at outputs $Out_P$ and $Out_N$ having different frequencies (e.g., higher and/or lower) than the original input signals (e.g., IF and LO). For example, using the mixer depicted in FIG. 1 an ideal mixer could theoretically generate frequencies $F_{LO}+F_{IF}$ and $F_{LO}-F_{IF}$. While in some situations, both frequencies may be considered desirable, in other situations one of the frequencies may be undesirable. For example, frequency $F_{LO}-F_{IF}$ may be an undesirable frequency, sometimes referred to as the image, can be filtered from the output signal (e.g., $Out_P$). In these implementations, the two frequencies can be spread by signal modulation to make filtering, such as filtering necessary to meet particular spectral masks, easier. Filtering the image from the output signal may allow for a single pure signal to be observed in the output signal. Unfortunately, as contemplated herein, some mixer components may distort or negatively affect the output signal in such a manner that the output signal is distorted (e.g., parasitic signal components).

One mixer component commonly understood and known to affect the output signal is the LO input associated with many frequency conversion circuits. In such frequency conversion circuits, the LO signal leaks through the circuit and is present in the output signal. LO leakage can result from systemic LO feedthrough, such as that resulting from the asymmetrical layout between differential branches of the mixer, and/or imperfect LO signal distribution to the quad devices (e.g., transistors $T_3$, $T_4$, $T_5$, and $T_6$ as depicted in FIG. 1), also referred to commutating devices 104. In some frequency conversion circuits, LO leakage can also result from random mismatches between transistors $T_1$ and $T_2$. Such mismatches may result in generating a differential DC component that is up-converted to an LO frequency at the differential output. In addition, random mismatches between transistors $T_3$ and $T_6$, can cause an additional LO feedthrough component. For example, changing the phase of the component produced by the mismatched transistors T1 and T2, or for example creating a separate additive LO feedthrough component with its own amplitude and phase. Overall, the effect of all the systematic and random mismatches is LO feedthrough at the output with a given amplitude and phase. Often, because LO leakage is generally positioned closer to desired signal frequencies, in comparison to the image, filtering of the LO leakage signal is more difficult.

Figure 2:
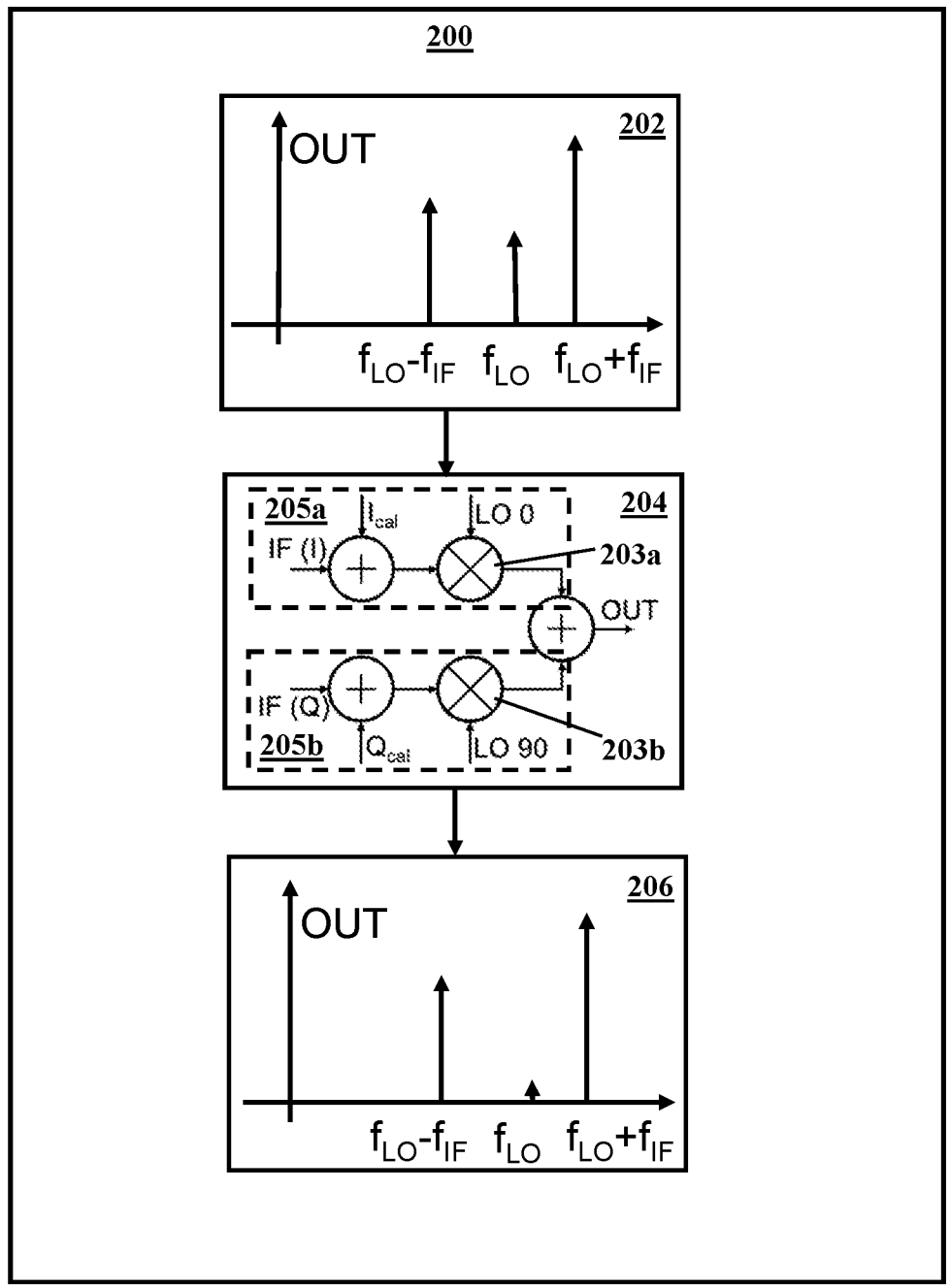
FIG. 2 depicts a block diagram of a conventional LO leakage suppression technique.

Referring now to FIG. 2, block diagram 200 is depicted demonstrating a conventional method of suppressing LO leakage in frequency conversion circuits. Block 202 demonstrates a frequency spectrum (e.g., frequency represented along the x-axis and amplitude represented along the y-axis) of an output signal of a conventional frequency conversion circuit, such as the mixer discussed in reference to FIG. 1, that does not suppress the LO leakage. As is shown in block 202, input signal IF and the LO signal are mixed together to convert the IF signal to one or more different frequencies. Such mixing can generate frequencies based on the sum (e.g., $F_{LO}+F_{IF}$) and difference ($F_{LO}-F_{IF}$) of the LO signal (e.g., $F_{LO}$) and the input signal (e.g., $F_{IF}$). Unfortunately, for reasons contemplated herein, the LO input signal can leak through the circuit and generate an undesirable parasitic signal (e.g., $F_{LO}$) in the output signal. This LO leakage results in a third frequency component $F_{LO}$ being added to the frequency spectrum and resulting signal of the output signal between $F_{LO}+F_{IF}$ and $F_{LO}-F_{IF}$. While the undesirable frequency (e.g., $F_{LO}-F_{IF}$) can usually be removed by filtering or using signal modulation, these same methods cannot usually be applied to remove or filter the LO leakage/$F_{LO}$ from the output signal due to the signal's proximity and position in the same frequency band as the frequency of interest (e.g., $F_{LO}+F_{IF}$). As such, $F_{LO}$ cannot be easily filtered without possibly influencing the frequency of interest.

Due to the aforementioned reasons, often additional circuitry/additional circuit architectures are used to suppress LO leakage. These additional circuit structures or devices usually require an increase in power consumption, increase of the area utilized on the chip, and the addition of other potential parasitic components that could further distort the output signal.

Block 204 depicts a conventional frequency conversion circuit with additional circuitry to provide LO leakage suppression. The frequency conversion circuit illustrated in Block 204 may act as an example to emphasize the structural and operational differences relative to embodiments of the present disclosure. The circuit architecture depicted in block 204 can be a I/Q single sideband mixer that uses two double balanced mixers (referred to hereinafter as mixers 203a and 203b, respectively). Each of the two double balance mixers can be configured to have the same circuit structure 100 described in reference to FIG. 1. For simplicity, the circuit depicted in block 204 has been separated into two mixer halves, mixer half 205a and 205b respectively. Mixer half 205a can receive input signal IF(I), calibration adjustments $I_{cal}$, and an LO signal having a 0-degree phase shift. Mixer half 205b can receive an input signal IF(Q), calibration signal $Q_{cal}$, and an LO signal having a 90-degree phase shift. Calibration adjustments $I_{cal}$ and $Q_{cal}$ can act as adjustable knobs to provide signals to their respective mixers that are exactly or approximately 90-degrees out of phase from each other. In addition, calibration adjustments $I_{cal}$ and $Q_{cal}$ can be adjusted to increase or decrease the amplitude. When calibration adjustments $I_{cal}$ and $Q_{cal}$ are added to their particular input signals, (e.g., IF(I) and IF(Q) respectively) a particular signal at $F_{LO}$ can be generated with a particular amplitude with a particular phase.

During operation, the resulting waveform from adding Lai to IF(I) is fed into mixer 203a and the waveform resulting from adding $Q_{cal}$ to IF(Q) fed into mixer 203b. The resulting waveform from adding $I_{cal}$ to IF(I) has a component at $F_{LO}$ with a particular amplitude and a 90-degree phase shift from the waveform resulting from adding $Q_{cal}$ to IF(Q). This combination results in a signal having the same or similar amplitude as the LO leakage signal but with a phase difference of 180-degree When the signals are added, the LO signal and associated LO leakage (e.g., $F_{LO}$) is cancelled out and effectively removed from the output signal.

The resulting output signal of the circuit represented in Block 204, demonstrating the LO leakage suppression, is provided in the frequency spectrum depicted in Block 206. While only one frequency conversion circuit (e.g., mixer depicted in FIG. 1) is necessary to convert the desired frequencies, the complex structure depicted in Block 204 of FIG. 2 is often necessary to mitigate the LO leakage. In some instances, while traditional circuits may use complex structure depicted in Block 204, such complex structures may be unnecessary in situations where the image may be filtered from the signal using other means.

Figure 3A:
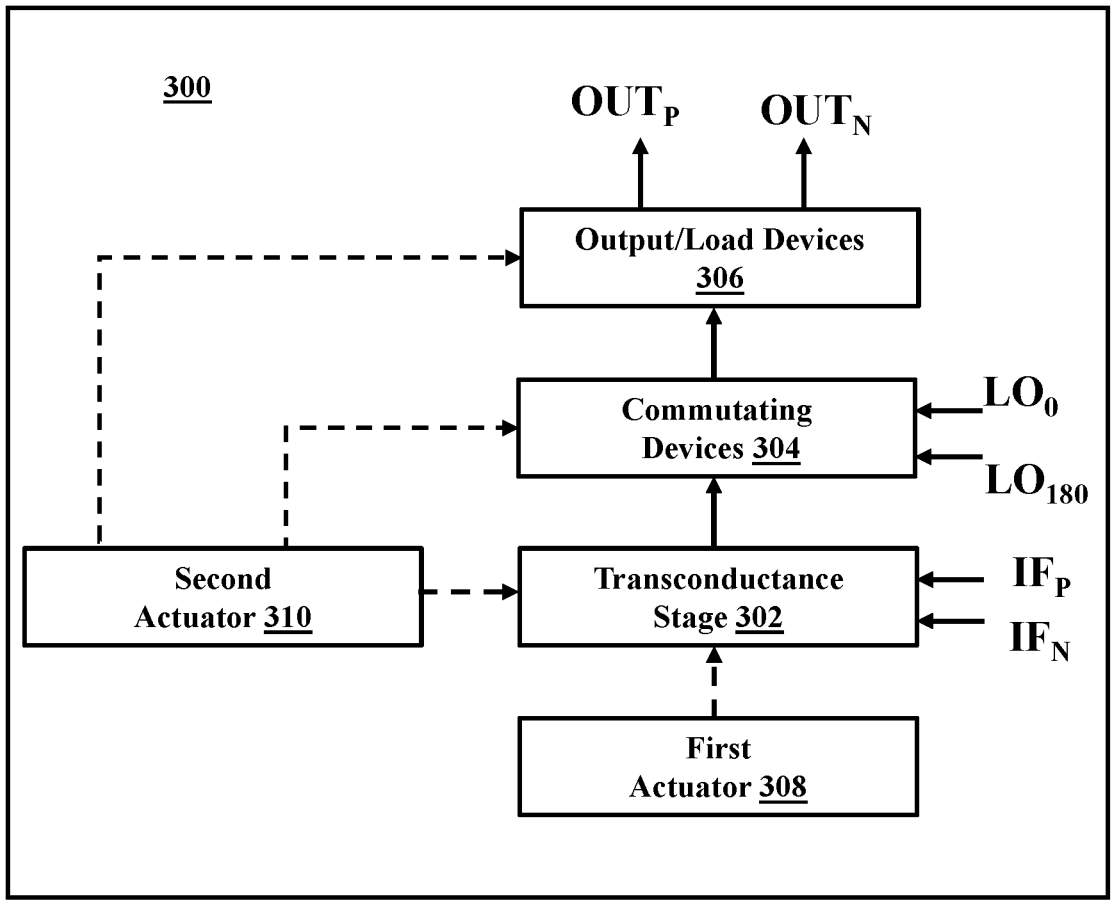
FIG. 3A depicts a simplified block diagram of a frequency conversion circuit structure, in accordance with embodiments of the present disclosure.
Figure 3B:
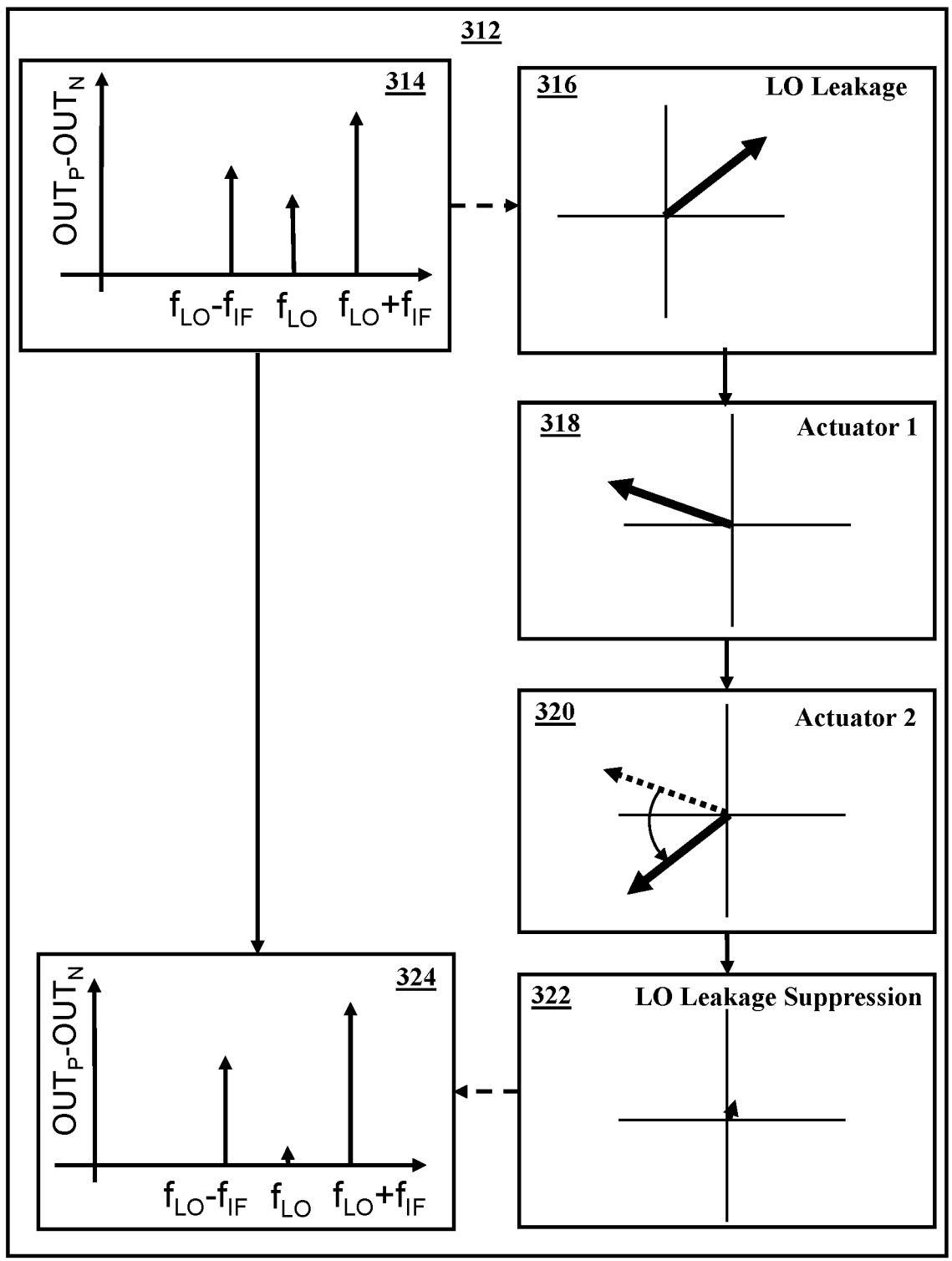
FIG. 3B illustrates a series of block diagrams demonstrating the changes associated with a first basis vector and a second basis vector during LO leakage suppression, in accordance with embodiments of the present disclosure.

Turning to FIGS. 3A-3B, simplified block diagrams associated with frequency conversion circuit 300 are depicted, in accordance with at least one embodiment of the disclosure. In embodiments, frequency conversion circuit 300 may be configured to suppress LO leakage (e.g., first leakage basis vector and second leakage basis vector) in the output signal (e.g., $OUT_P$ and $OUT_N$). Frequency conversion circuit 300 may be configured using any mixer/frequency conversion circuit structure configuration, capable of converting one or more frequencies. Frequency conversion circuit 300 may include circuit modules, differential transconductance stage 302, commutating devices 304 (e.g., quad switching devices), and output/load components 306. While examples contemplated herein may make reference to a first basis vector and a second basis vector as amplitude and phase, respectively, such terms are meant as examples only and are not intended to suggest any limitation as to the scope of use or functionality of embodiments of the invention described herein. As such, any coordinate system may be interchangeably used to discuss the particular position/vectors associated with first basis vector and second basis vector (e.g., cartesian coordinate system, polar coordinate system, exponential coordinate system, etc.).

In some embodiments, differential transconductance stage 302, commutating devices 304, and output/load components 306 may be configured as a double sideband mixer (such as the mixer referenced in FIG. 1). While embodiments contemplated herein often reference reducing or suppressing LO leakage, such embodiments may also be configured to reduce or suppress other similar undesirable/parasitic signals that may appear in the output signal (e.g., $OUT_P$ and $OUT_N$). In embodiments, a positive and negative input signal (e.g., $IF_P$ and IFN or $RF_P$ and $RF_N$, depending on the implementation) can be fed to differential transconductance stage 302 and LO signal inputs (e.g., $LO_0$ and $LO_{180}$) can be fed into commutating devices 304. Block 314 depicts an example frequency spectrum demonstrating the output signal of frequency conversion circuit 300 without LO leakage suppression. As contemplated herein, when LO leakage is not suppressed or offset a corresponding parasitic signal component can appear in the output signal, such as the $F_{LO}$ peak depicted in frequency spectrum of block 314. This LO leakage or parasitic signal component (e.g., $F_{LO}$) is depicted in the phasor diagram Block 316. Block 316 depicts the phasor diagram of $F_{LO}$ or LO leakage signal, having a particular first leakage basis vector and particular second leakage basis vector.

In embodiments, frequency conversion circuit 300 may further include first actuator 308 and second actuator 310. First actuator 308 and second actuator 310 may be configured to suppress the LO leakage signal in frequency conversion circuit 300 and prevent LO leakage from impacting the output signal (e.g., frequency spectrum depicted in Block 324). While in some embodiments, first actuator 308 and second actuator 310 may be configured together within frequency conversion circuit 300, in other embodiments, first actuator 308 and second actuator 310 may be configured separately within frequency conversion circuit 300. (See FIGS. 4A-4E.)

In embodiments, first actuator 308 may be configured to provide LO leakage suppression coverage by providing one or more calibrations or adjustments (e.g., first basis vector) to frequency conversion circuit 300. More particularly, the calibration or adjustments generated by first actuator 308 may act as an first basis vector correction (e.g., amplitude correction) method and may adjust/calibrate a first basis vector to suppress or offset the first leakage basis vector (e.g., amplitude) of the LO leakage signal. Block 318 depicts an example phasor diagram of the first LO leakage basis vector correction applied by the first actuator 308. In embodiments, first actuator 308 may be configured within/proximate to transconductance stage 302. In these embodiments, first actuator 308 may control the differential direct current (DC) current of transconductance stage 302. By adjusting the currents in the two differential transistors of transconductance stage 302 (e.g., depicted in FIG. 4A), the relative first basis vector of the LO leakage from the two halves of the quad switching devices is adjusted.

Figure 4A:
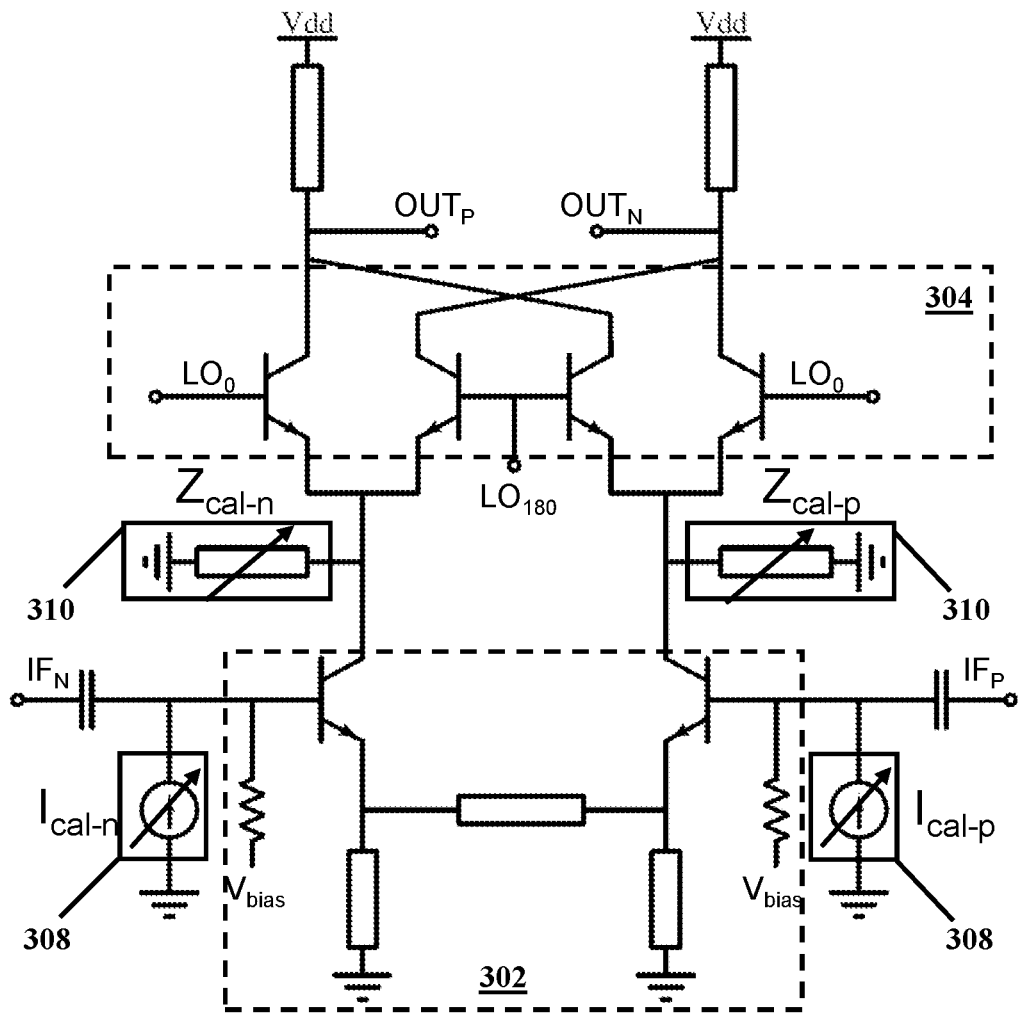
FIG. 4A depicts a schematic view of a first configuration of a frequency conversion circuit structure, in accordance with embodiments of the present disclosure.

In embodiments, second actuator 310 may be configured to provide LO leakage suppression coverage by providing one or more calibrations or adjustments to frequency conversion circuit 300. More particularly, the calibration or adjustments (e.g., second basis vector) generated by second actuator 310 may provide asymmetric differential loading and act as a correction method along a second basis vector (e.g., a phase correction). Block 320 depicts an example phasor diagram of LO leakage correction after second actuator 310 applies second basis vector correction (e.g., phase correction or phasor rotation). In embodiments, second actuator 310 may be configured within/proximate to transconductance stage 302. In these embodiments, second actuator 310 may adjust the second basis vector of LO leakage through the transconductance stage 302 (e.g., the different legs of the quad switching devices of the transconductance stage as depicted in FIG. 4A), to offset the second leakage basis vector associated with the LO leakage signal. For example, the second actuator can adjust/calibrate the phase (e.g., second basis vector) to be 180 degrees (or approximately 180 degrees) out of phase of the phase of the LO leakage signal (e.g., second leakage basis vector). By adding the second basis vector and the second leakage basis vector, resulting from actuator 1 318 (e.g., first actuator) and actuator 2 320 (e.g., second actuator) to the LO leakage signal 316, the two waveforms will be suppressed or offset/canceled.

When the effects provided by first actuator 308 and second actuator 310, as depicted in example phasor diagrams in Blocks 318 and 320 respectively, are combined together, the result is the reduction or suppression of the LO leakage. An example of the resulting LO leakage suppression may be viewed in the phasor diagram depicted in Block 322. An example of the output signal ($OUT_P$ and $OUT_N$) generated by frequency conversion circuit 300 is depicted in the frequency spectrum in Block 324. As is demonstrated by this frequency spectrum, the $F_{LO}$ is significantly reduced if not completely suppressed, and is unlikely to distort/affect the output signal.

As discussed herein, after LO leakage or $F_{LO}$ may be suppressed or significantly reduced in final output frequency spectrum 324 the image or undesired frequency (e.g., $F_{LO}-F_{IF}$) can be filtered from the final output signal in order to isolate the particular frequency of interest (e.g., $F_{LO}+F_{IF}$) and create a pure signal. Signal purity is often a critical requirement for many communication or wireless systems. In particular, quantum electronics and their corresponding applications require a high level of signal purity. As such, circuit architecture and techniques contemplated herein can be directly applicable to quantum electronics, particularly in implementations where a single-sideband mixer architecture is not needed or cannot be used.

Turning now to FIGS. 4A-4E, depicted are circuit schematics depicting one or more placements of first actuator 308 and/or second actuator 310 within frequency conversion circuit (e.g., frequency conversion circuit 300), in accordance with at least one embodiment of the disclosure. is often dependent on the designed implementation of the circuit of interest. Similar identifiers and discussed in reference to FIGS. 3A-3B, are carried over throughout FIGS. 4A-4E to depict the same or similar structures with the same or similar functions. While in some embodiments, first actuator 308 and/or second actuator 310 can be incorporated into one or more of the circuit modules (e.g., differential transconductance stage 302, commutating devices 304, and/or output/load components 306), in other embodiments, first actuator 308 and/or second actuator 310 can be independently configured and situated independently within frequency conversion circuit 300. In embodiments, the location or placement of first actuator 308 and/or second actuator 310 within frequency conversion circuit 300 is often dependent on the designed implementation of the circuit of interest. Additional embodiments and discussion associated with first actuator 308 and second actuator 310 placement is provided in FIGS. 4A-4E.

While FIGS. 4A-4E provide many embodiments configured using bipolar junction transistors (BJTs) or similar transistor devices, any transistor type (e.g., CMOS) may also be used. More particularly, frequency conversion circuits 400A-400E, respectively represented in FIGS. 4A-4E demonstrate how first actuator and second actuator (e.g., first actuator 308 and second actuator 310) can be configured within a frequency conversion circuit, without the use of excessive circuitry as referenced in FIG. 2. While the frequency conversion circuits represented in FIGS. 4A-4E demonstrate the placement of first actuator and second actuator within a single mixer type (e.g., double sideband mixer), the use of only one mixer type is for clarity only and should not be construed limiting the various embodiment provided in this disclosure. As such, while FIGS. 4A-4E depict example embodiments showing the placement and integration of first actuator 308 and second actuator 310 within double-sideband mixer circuit structure, other mixer circuit architectures may also be utilized.

In embodiments, first actuator and second actuator can be placed or integrated at different locations within the frequency conversion circuit (e.g., frequency conversion circuit 400A-400E) depending on the desired implementation or intended use. While various embodiments are discussed in reference to FIG. 4A, many of these embodiments, unless explicitly stated (e.g., for comparison between the different circuit structure embodiments) can be carried over to FIGS. 4B-4E and other embodiments disclosed herein referencing frequency conversion circuit architecture (e.g., frequency conversion circuit 300) or systems.

FIGS. 4A-4E in combination with FIG. 3A, depict an example embodiment of frequency conversion circuits 400A-E. As similarly discussed in reference to frequency conversion circuit 300 of FIG. 3A, frequency conversion circuits 400A-E can be configured to have a differential transconductance stage 302, commutating devices 304, output/load devices, first actuator 308 (e.g., $I_{cal-n}$ and $I_{cal-p}$ or $V_{bias-n}$ and $V_{bias-p}$) and second actuator 310 (e.g., $Z_{cal-n}$ and $Z_{cal-p}$). As shown in FIGS. 4A-4E, first actuator 308 and second actuator 310 can be positioned at various location within frequency conversion circuit 400A-E. Considerations associated with determining where to place first actuator 308 and/or second actuator 310 in frequency conversion circuit 400A-E may include, but are not limited to: (i) positioning first actuator 308 and/or second actuator 310 in such a manner as to avoid other associated parasitic components from affecting the output signal; (ii) the amount of available chip area needed to establish the devices associated with first actuator 308 and/or second actuator 310; (iii) required devices comprising first actuator 308 and/or second actuator 310 required to perform the herein discussed biasing or calibration of first actuator 308 and/or second actuator 310 (e.g., device components may change or change value depending on the particular environment of the actuator) within frequency conversion circuits 400A-E; (iv) the orthogonality of the effect produced by either the first actuator and/or the second actuator (e.g., the more orthogonal calibration produced by each the first and second actuators, the more likely the LO leakage may be suppressed); (v) or any combination thereof.

Figure 4B:
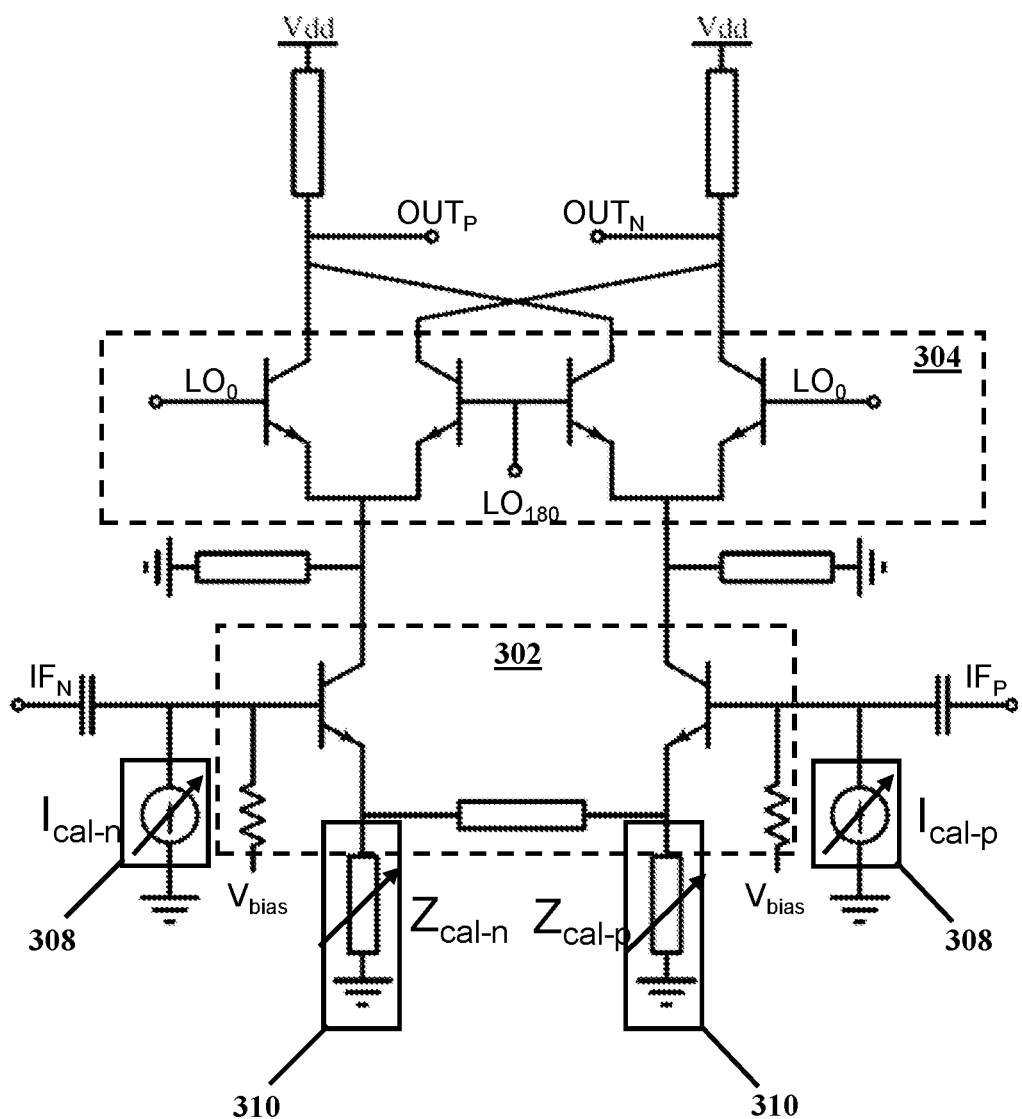
FIG. 4B depicts a schematic view of a second configuration of a frequency conversion circuit structure, in accordance with embodiments of the present disclosure.

One example of such considerations can be viewed when comparing the positioning of second actuator 310 in FIG. 4A (e.g., frequency conversion circuit 400A) to the positioning of the second actuator 310 in FIG. 4B (e.g., frequency conversion circuit 400B). FIG. 4A depicts frequency conversion circuit 400A with second actuator 310 (e.g., $Z_{cal}$ configured with a capacitive digital to analog converters (C-DACs)) positioned between (e.g., in parallel) differential transconductance stage 302 and commutating devices 304. FIG. 4B depicts frequency conversion circuit 400B with second actuator 310 (e.g., $Z_{cal}$ configured with a capacitive DACs) positioned in parallel with a resistor. In some embodiments this resistor may have a fixed value (e.g., fixed $R_{degen}$). While frequency conversion circuits 400A and 400B depicted in FIG. 4A and FIG. 4B respectively, can both produce similar suppression of LO leakage in the output signal, the configuration and value of devices comprising second actuator 310 may differ depending on the particular range of impedance required to sufficiently cover the potential LO leakage (e.g., for the given frequency of operation). For example, depending on the particular impedance range needed, the number and size of utilized capacitors may increase or decrease. In embodiments, the impedance range may differ depending on where second actuator 310 is located in the circuit as the various circuit devices interact with each other. When comparing the circuits in FIG. 4A and FIG. 4B, the second actuator 310 in FIG. 4A is likely to require a higher impedance range (lower capacitance range in a capacitive DAC implementation) than the impedance range associated with the second actuator in FIG. 4B based on their respective positions within the frequency conversion circuit. As a result of this position difference to be implemented the capacitive DACs are likely to require not only changes in the number of capacitor but also capacitor values.

Figure 4C:
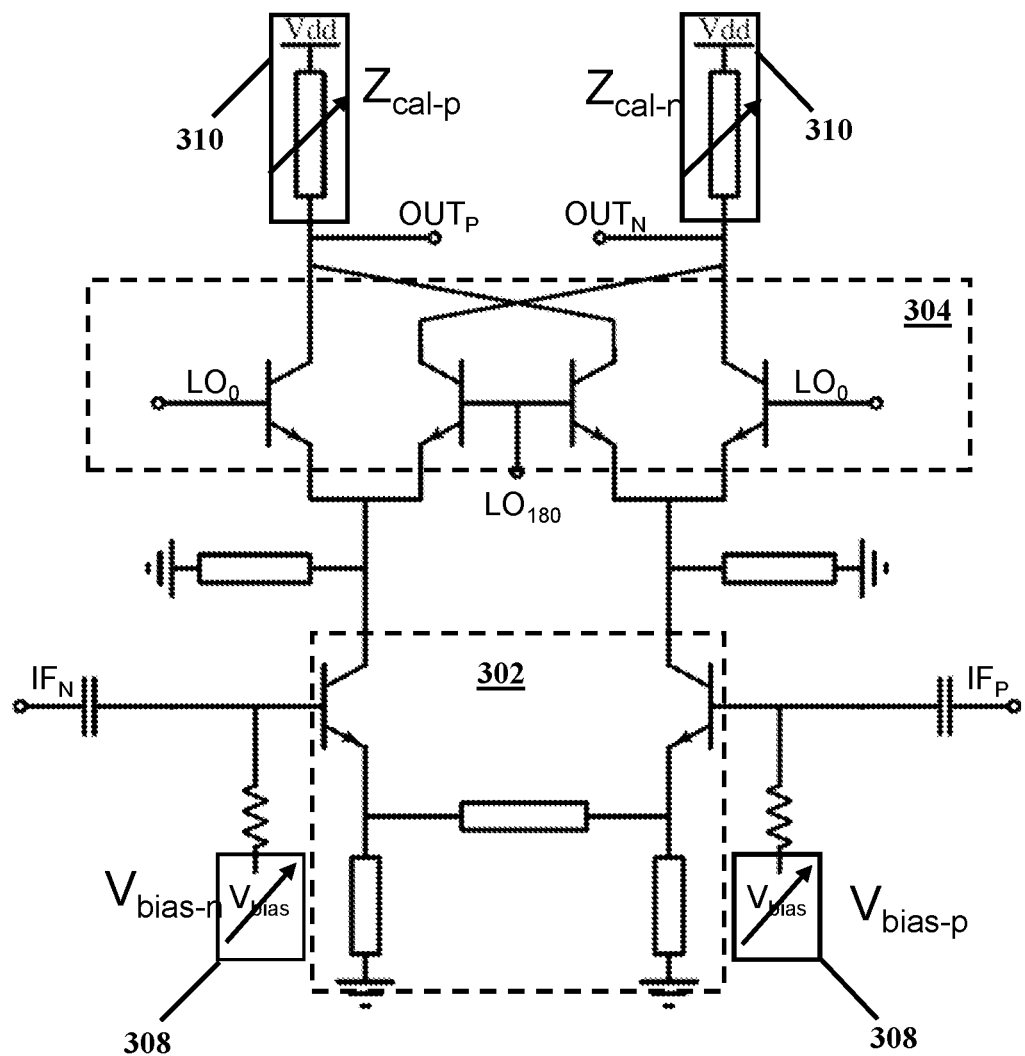
FIG. 4C depicts a schematic view of a third configuration of a frequency conversion circuit structure, in accordance with embodiments of the present disclosure.
Figure 4D:
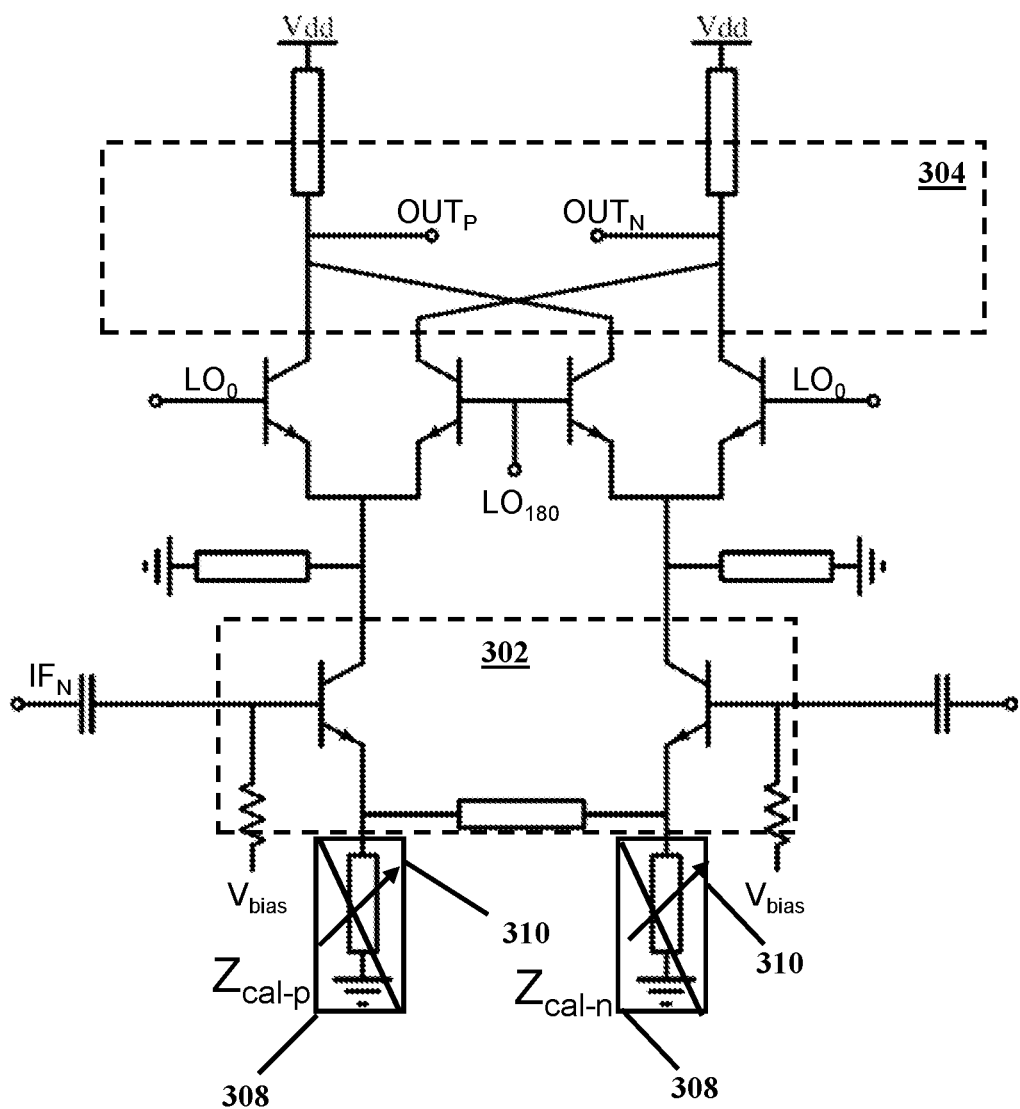
FIG. 4D depicts a schematic view of a fourth configuration of a frequency conversion circuit structure, in accordance with embodiments of the present disclosure.
Figure 4E:
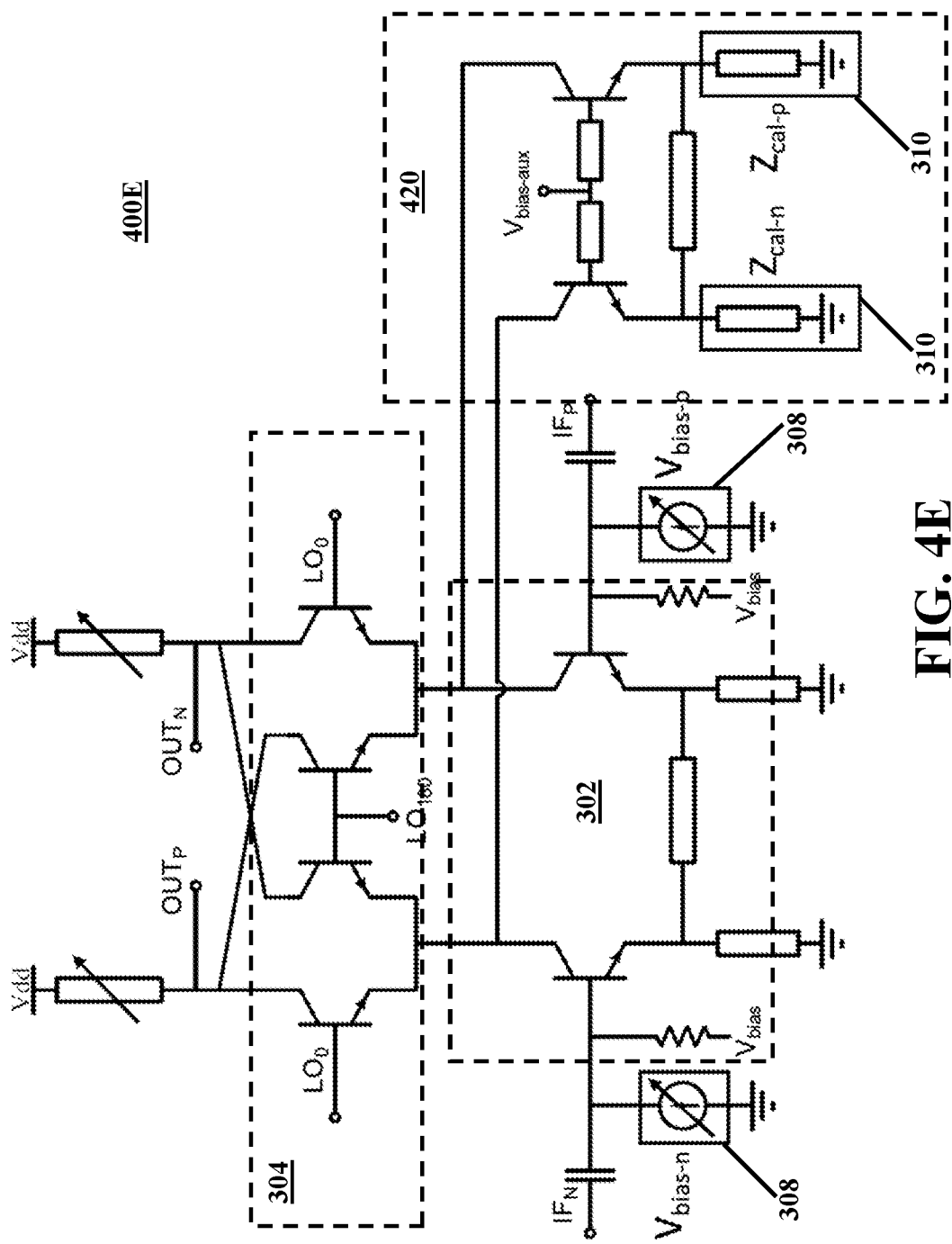
FIG. 4E depicts a schematic view of a fifth configuration of a frequency conversion circuit structure, in accordance with embodiments of the present disclosure.

FIGS. 4C-4E include embodiment circuits showing other possible frequency conversion circuits with different positioning of first actuator 308 and second actuator 310. FIG. 4C depicts frequency conversion circuit 400C with first actuator 308 comprised of devices performing calibration and/or manipulation (e.g., voltage biasing). FIG. 4C also depicts second actuator 310. In this configuration, second actuator 310 can include, but is not limited to, various devices such as, capacitive DACs, resistive DACs, or any combination thereof, that may be required to produce the necessary impedance ranges (e.g., phase shift). FIG. 4D depicts frequency conversion circuit 400C where first actuator 308 and second actuator 310 are configured together in a similar position. In these embodiments, first actuator 308 and second actuator 310 may be comprised of both resistive and capacitive components. In some embodiments, first actuator 308 and second actuator 310 may share some device components (e.g., particular DACs may be shared) used to calibrate or optimize the different calibration changes associate with first actuator 308 and second actuator 310 needed to suppress or mitigate the appearance of LO leakage in the output signal.

FIG. 4E depicts a frequency conversion circuit 400E having auxiliary circuitry 420 that may act as an intermediary between second actuator 310 and the main mixer circuit. In embodiments, auxiliary circuit 420 and second actuator 310 may be configured using capacitive and/or resistive devices (e.g., resistive DACs). Such configurations can be used to further supplement the devices within second actuator 310 (e.g., additional space or devices necessary to generate a higher impedance are required) to ensure the necessary impedance range can be produced. In other embodiments, auxiliary circuit 420 may be used to mitigate other potentially parasitic components from negatively affecting the output signal (e.g., $OUT_P$ and $OUT_N$). For example, if auxiliary circuit 420 or second actuator 310 included devices and/or signals that could potentially generate a parasitic signal component that may affect the output signal, one solution would be to distance those components from the vicinity of the output signal.

As discussed herein, while FIGS. 4A-4E demonstrate different positioning of first actuator 308 and second actuator 310 incorporated in a double sideband mixer at varying positions, different mixer architectures, other than double sideband mixers, can be used. As such, while embodiments disclosed herein often only refer to two different actuators (e.g., first actuator 308 and second actuator 310) these component devices may be understood to be representative of one or more devices that when compiled can result in the same effects as first actuator 308 and/or second actuator 310. For example, in some embodiments having frequency conversion circuits where LO leakage suppression is desired, but where available chip area is limited, first actuator 308 and second actuator 310 can include one or more sub-actuators placed/integrated at different areas within the frequency conversion circuit that, when working in the aggregate, allow for the suppression of LO leakage in the output signal, while also allowing for the devices to be strategically placed at areas on the chip that are too small for a single unit actuator (e.g., as reference in FIGS. 5A and 5B) to be placed in its entirety at one location within the frequency conversion circuit.

Figure 5A:
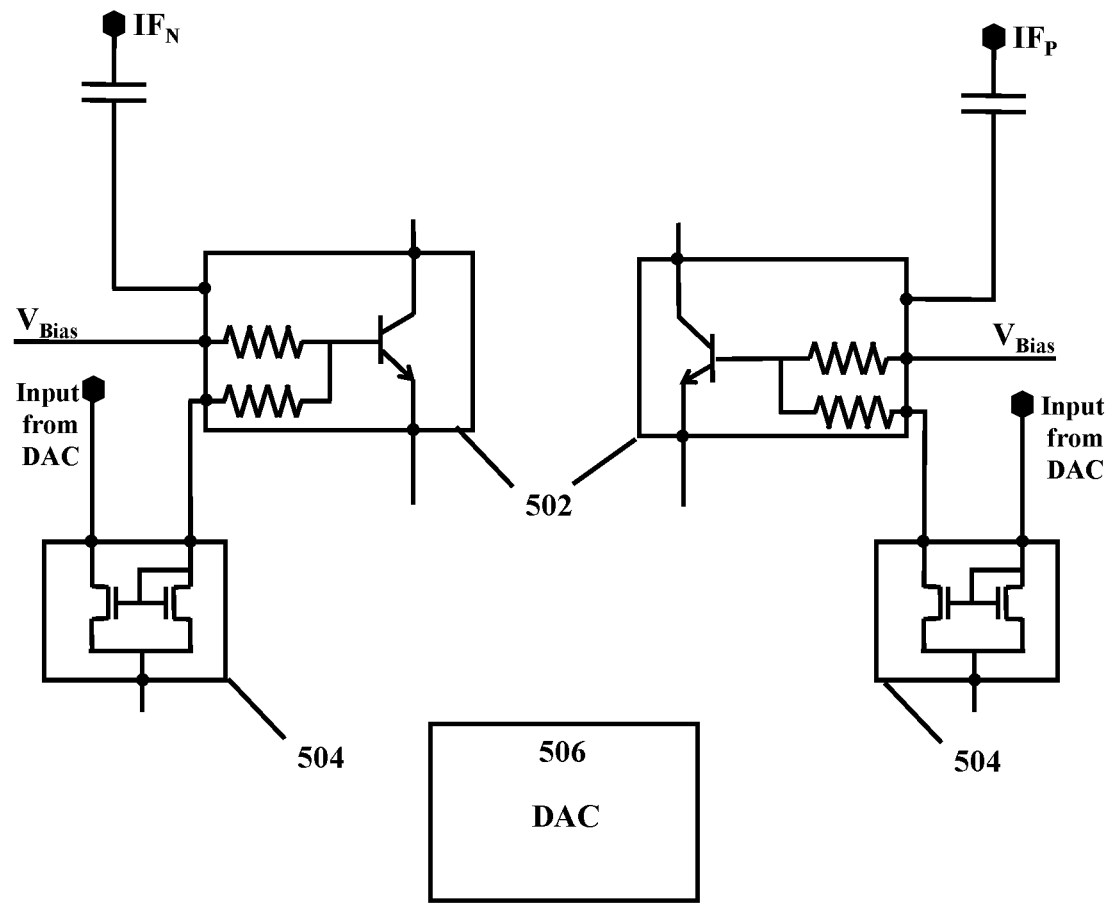
FIG. 5A depicts a schematic view of a first actuator structure, in accordance with embodiments of the present disclosure.

Turning now to FIG. 5A, an example circuit schematic environment 500 is depicting how first actuator (e.g., DC circuit term adjustment) may be implemented within a transconductance stage 502 of a frequency conversion circuit (such as the embodiment depicted in FIG. 4A), in accordance with embodiments of the disclosure. First actuator may include any circuit component having any value wherein the configuration enables first actuator to provide a first basis vector for the LO cancellation space as contemplated herein using a DC circuit component (e.g., DC current or DC voltage). In one example embodiment, first actuator may include a current mirror 504 configured to receive current from a DAC 506 (digital to analog converter). In other embodiments, the first actuator could be configured using emitter resistor DACs, and/or collector/emitter current DACs. In embodiments, by adjusting the currents in the two differential transistors of transconductance stage 502, the first basis vector may be calibrated or adjusted to offset the first leakage basis vector associated with the LO leakage from the two halves of the quad switching devices. In one example embodiment, as depicted in circuit schematic environment 500, the first actuator may suppress the first leakage basis vector associated with LO leakage by calibrating or tuning/adjusting the base current using particular increments of current (e.g., 125 nA steps).

Figure 5B:
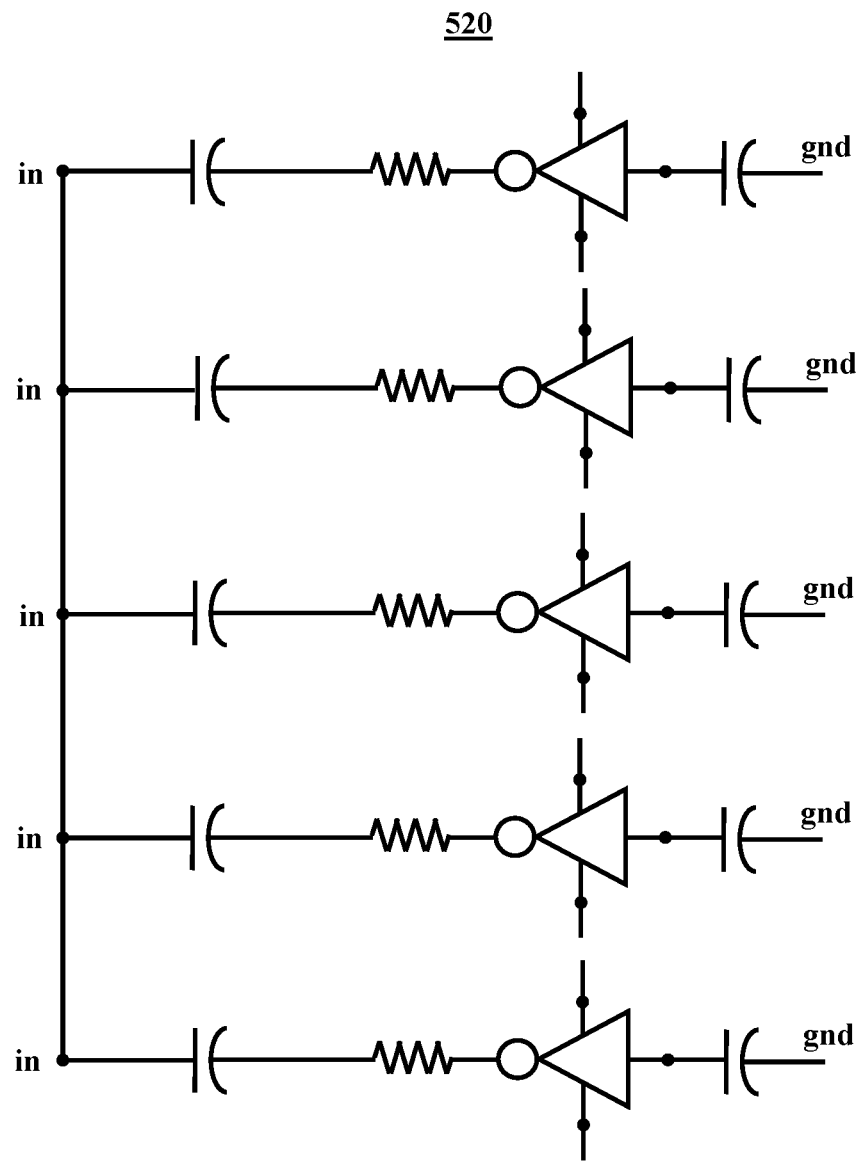
FIG. 5B depicts a schematic view of a second actuator structure, in accordance with embodiments of the present disclosure.

Turning now to FIG. 5B, an example circuit schematic of second actuator 520 (e.g., differential impedance) is depicted, in accordance with at least one embodiment of the disclosure. In embodiments, second actuator 502 may provide or adjust a second basis vector of LO leakage (e.g., to generate a differential impedance) through the different legs of the quad switching devices, such that the combined effect with the first actuator is to produce an LO signal to be 180 degrees out of phase with respect to the intrinsic LO leakage. This would result in the LO leakage in the double-balanced mixer would be out of phase, resulting in the LO leakage waveforms cancelling at the output.

In some embodiments, second actuator 520 may include at least a DAC (e.g., having 1 fF steps) placed at the IF collectors (e.g., emitters of the Quad devices). In such embodiments, the DAC may be comprised of capacitors that allow for the calibration or adjustment of the second actuator to generate a differential impedance. In some embodiments, capacitors, such as 1 fF capacitors, may be used to precisely adjust the second basis vector (e.g., to change the impedance) to provide the necessary suppression and/or offset the second leakage basis vector. In some embodiments, the second actuator may be implemented as a variable reactive component placed as degeneration impedance to the differential pair, where each variable reactive component can be controlled independently (See FIGS. 4B-4E). In some embodiments, the second actuator may be implemented as a variable reactive component placed at each of the transconductance stage differential outputs, where each variable reactive component may be controlled independently.

In embodiments, first actuator 308 and/or second actuator 310 may be electronically controlled (e.g., via analog or digital means) to produce the calibration signals/adjustments (e.g., first basis vector and second basis vector changes, or changes along amplitude and phase) capable of suppressing or reducing LO leakage (e.g., first leakage basis vector and second leakage basis vector) in the output, as contemplated herein. The use of first actuator 308 and second actuator 310 may allow for the entire space of LO leakage (e.g., as demonstrated by the phasor diagrams depicted in FIG. 3B), manifesting as a result of systematic and/or random mismatch variations among devices comprising frequency conversion circuit 300, to be covered. In other words, LO leakage could take any waveform, but due to the combined capabilities of first actuator 308 and second actuator 310, a significant portion or entire waveform may be suppressed.

In other embodiments, first actuator 308 and second actuator 310 can be configured during chip manufacturing to provide for specific LO leakage suppression based on experimental data predicting the potential LO leakage suppression parasitic signal components (e.g., magnitude/amplitude and phase of the parasitic signal). However, LO leakage and resulting waveforms (e.g., having phase and amplitude) may change depending on the environment of the circuit. For example, an increase or decrease in the temperature of the circuit may affect the LO leakage (e.g., may cause changes in the amplitude or phase of the LO waveform). In another example, change in the amplitude (e.g., first basis vector), and phase or frequency (e.g., second basis vector) of the LO input into the mixer may also affect LO leakage. As such, in some embodiments, first actuator 308 and/or second actuator 310 can be configured to use methods (e.g., optimization algorithms and/or machine learning techniques) that can respond to particular LO leakage parasitic signal components observed in the output signal by adjusting or modifying (e.g., electronically controlling) first actuator 308 and/or second actuator 310 to induce signal changes within the frequency conversion circuit 300.

Figure 6:
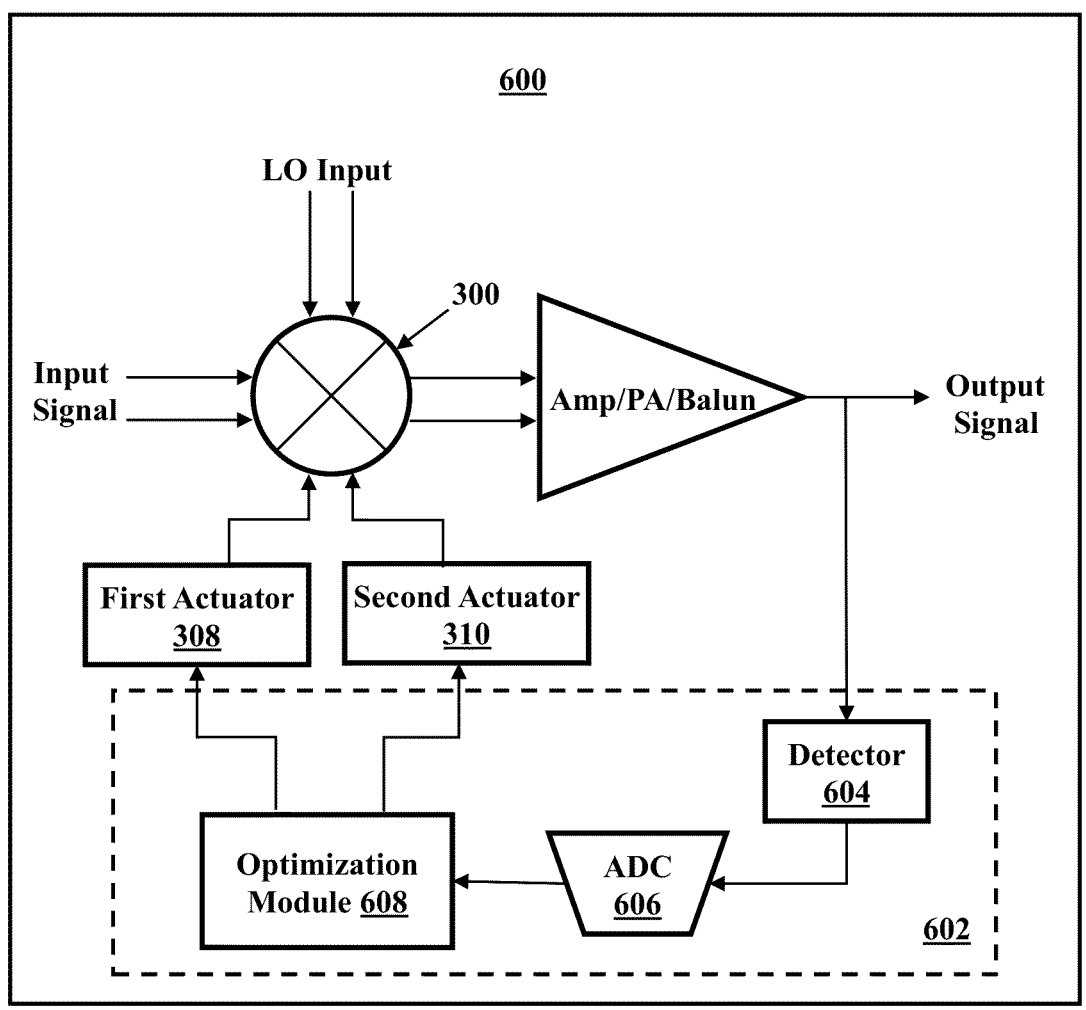
FIG. 6 depicts a schematic view of a frequency conversion circuit system, in accordance with embodiments of the present disclosure.

Referring now to FIG. 6, depicts an exemplary frequency conversion system 600 !!!configured to suppress/reduce LO leakage, in accordance with embodiments of the present disclosure. Such embodiments may be used to ensure first actuator and second actuator are properly calibrated to provide the necessary first basis vector correction and second basis vector correction necessary to suppress/reduce LO leakage. In embodiments, frequency conversion system 600 may be configured to have calibration loop 602 (e.g., calibration control module). Calibration loop 602 may include, but is not limited to, detector 604, analog to digital converter (ADC) 606, and/or optimization algorithm module 608. Detector 604 can receive the output signal resulting from frequency conversion circuit 300. While in some embodiments, detector 604 receives the output signal directly from frequency conversion circuit 300, in other embodiments, the output signal arising from frequency conversion circuit 300 may be further modified, for example with the use an amplifier or balun, before being fed to detector 604. Depending on the particular implementation, ADC 606 may be configured within detector 604 or may be configured separately. Information observed in the output signal by detector 604 may then be converted from a digital signal to an analog signal, if necessary. In some embodiments, detector 604 may detect or provide one or more circuit parameters, such as the first leakage basis vector and the second leakage basis vector (e.g., amplitude and phase, respectfully), or either the first leakage basis vector or the second leakage basis vector. In some embodiments, circuit parameters may include circuit temperature, current, voltage, amplitude, phase, or any combination thereof. In some embodiments, the LO input may be coupled to detector 604. For example, the detector maybe coupled electrically or electro-magnetically. Such embodiments enable frequency conversion system 600 to use this as a reference phase. In some embodiments, detector 604 may be an energy detector (see FIGS. 7A-7C). In these embodiments, only the amplitude or first leakage basis vector may be known. Detector 604 may also be configured to include one or more mixers that can be configured to calculate both the first leakage basis vector and the second leakage basis vector. Information observed in the output signal by detector 604 may then be received by optimization algorithm module 608.

In embodiments, optimization algorithm module 608 can generate/reconfigure calibration signals/adjustments associated with first actuator 308 and/or second actuator 310 in response to the information observed by detector 604 in the output signal. The generation/reconfiguration of calibration signals/adjustments associated with first actuator 308 and/or second actuator 310 can be modified or adjusted in such a way to ensure the parasitic signal component arising from LO leakage (e.g., first leakage basis vector and second leakage basis vector) may be suppressed/offset from the output signal. As contemplated herein, by generating a waveform having the same or similar amplitude (e.g., first basis vector) with an opposite, or nearly opposite phase (e.g., second basis vector) shift (e.g., 180-degree phase difference) can result in cancelling or suppressing the appearance of the LO leakage in the output signal.

Figure 7A:
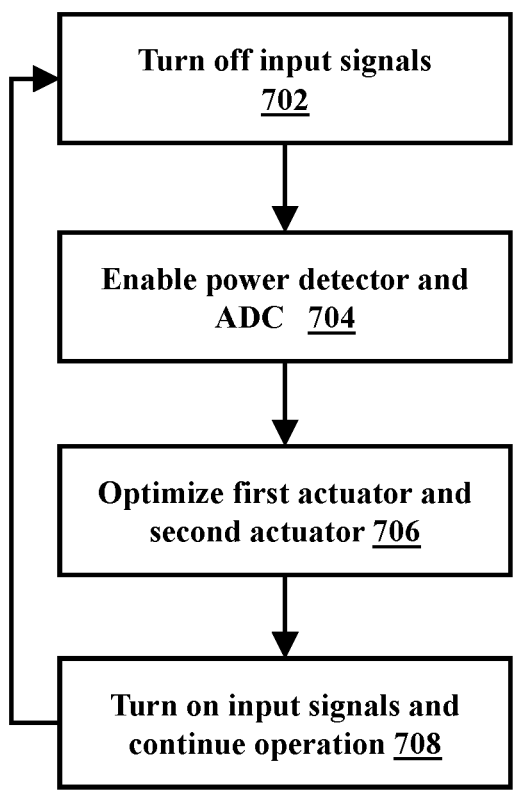
FIG. 7A is a flowchart of an exemplary method for suppressing LO leakage, in accordance with embodiments of the present disclosure.

Turning now to FIG. 7A, depicted is a flowchart diagram demonstrating an exemplary method 700 depicting methods and techniques for calibrating first actuator 308 and second actuator 310 to suppress/reduce LO leakage in a frequency conversion system, such as frequency conversion system 600, in accordance with embodiments of the present disclosure. In embodiments, method 700 may be configured by optimization module 608. In some embodiments, a processor of a system may perform the operations of the method 700. In some embodiments, method 700 begins at operation 702.

At operation 702, the input signal (e.g., IF or RF) is turned off and not received by frequency conversion circuit 300. In embodiments, when the input signal is turned off, the LO input signal continues to be received by frequency conversion circuit 300. As such, in these embodiments, the LO signal (e.g., LO leakage/$F_{LO}$) is likely to be the predominate signal represented in the output signal. These embodiments can allow for the LO signal to be isolated in the output signal. In embodiments, the input signal can be turned off at particular instances including, but not limited to, periodic time intervals, when a change in the environment of frequency conversion circuit 300 is detected (e.g., via temperature sensor), during transceiver down times, during receiver modes, or any combination thereof. In some embodiments, method 700 proceeds to operation 704.

At operation 704, detector 604 and/or ADC 606 may be enabled. In embodiments, detector 604 may receive the output signal. In embodiments where the input signal to frequency conversion circuit 300 is turned off, but the LO signal is maintained, allows detector 604 to detect signal characteristics (e.g., amplitude/first basis vector and/or phase/second basis vector) associated with the LO signal. In some embodiments, method 700 proceeds to operation 706.

At operation 706, method 700 can optimize first actuator 308 and second actuator 310 using one or more optimization algorithms (e.g., via optimization algorithm module 608). In some embodiments, optimization algorithm module 608 can be configured to use a gradient decent optimization. In other embodiments, optimization algorithm module 608 can be configured to optimize one dimension or basis vector at a time (e.g., first basis vector may be optimized independently of second basis vector). For example, optimization algorithm module 608 may first optimize the calibration signal associated with first actuator 308. Then, once the calibration signal associated with first actuator 308 is completed, optimization algorithm module 608 may then optimize the calibration signal associated with second actuator 310. While the immediate example states first actuator 308 is optimized prior to second actuator 310, depending on the information observed in the output signal via detector 604, second actuator 310 may be optimized prior to first actuator 308. While in some embodiments, both first actuator 308 and second actuator 310 may each be optimized, in other embodiments, only one (e.g., either first actuator 308 or second actuator 310) may be optimized. In these embodiments, how, when, and if each first actuator 308 and second actuator 310 may be optimized is determined as a result of the information observed in the output signal via detector 604 as well as other system parameters (e.g., temperature, change of system configuration or frequency). For example, if the LO leakage signal observed in the output signal is determined by optimization algorithm module 608 to need a minor adjustment (e.g., modification/calibration) and such an adjustment can be accomplished by optimizing the calibration signal associate with one of the actuators, then only one actuator and not both first actuator and second actuator need to be optimized. In some embodiments, optimization algorithm 608 may be configured to use a brute force search algorithm. In some embodiments, method 700 proceeds to operation 708.

At operation 708, method 700 can turn on the input signal (e.g., IF or RF). In embodiments, when the input signal is turned on, the frequency conversion circuit 300 can begin processing the input signal. In embodiments, because first actuator 308 and/or second actuator 310 have been optimized (e.g., using optimization methods contemplated herein) their respective calibration signals/adjustments can allow for the LO leakage to be suppressed in the output signal. In some embodiments, the detector may be able to detect the characteristics of the LO leakage (e.g., amplitude and/or phase) even with input signals on. In these embodiments, operation 702 may be skipped. In some embodiments, after operation 708, the method 700 may end.

Figure 7B:
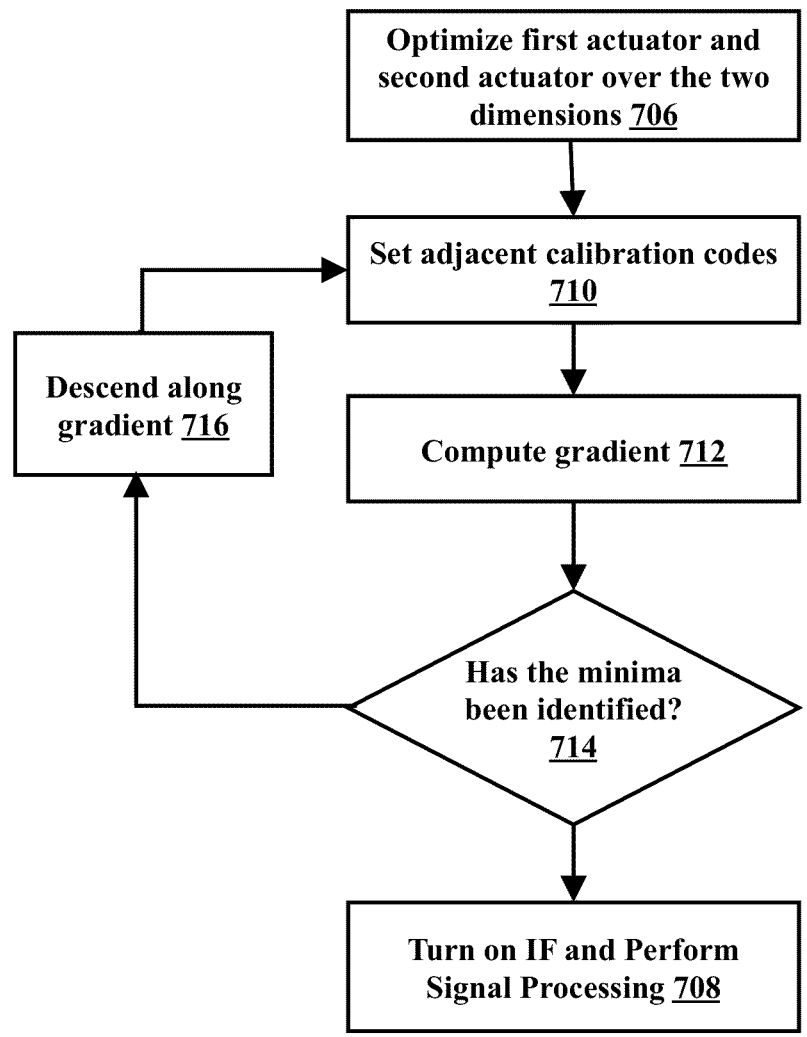
FIG. 7B is a flowchart of an exemplary method for optimizing LO leakage suppression, in accordance with embodiments of the present disclosure.

Turning to FIG. 7B, depicted is a flowchart diagram 700b demonstrating a continuation of optimization method 700, particularly operation 706, depicting a method optimizing the calibration signals/adjustments associated with first actuator 308 and/or second actuator 310 in order to suppress/reduce LO leakage in a frequency conversion system (e.g., frequency conversion system 600), in accordance with embodiments of the present disclosure. In embodiments, method 700b may be further configured by optimization module 608. In some embodiments, a processor of a system may perform the operations of the method 700b. In some embodiments, method 700b begins as a sub-component of operation 706, while in other embodiments, the following operations (e.g., operations 710, 712, 714, and 716) are independent operations occurring separate and after operation 706. At operation 710, the processor may determine and/or set calibration codes. In some embodiments, method 700b proceeds to operation 712.

At operation 712, the processor may compute the gradient descent algorithm. In some embodiments, method 700b proceeds to operation 714.

At operation 714, the processor may determine if the minima (e.g., convergence) has been reached based, at least in part on the gradient descent algorithm. While in embodiments, the minima may be identified when the gradient descent is equal to zero, in other embodiments, the minima may be a threshold value that once reached, may be rounded down to zero. In embodiments where the minima have been identified, method 700b proceeds to operation 708. In embodiments where the minima have not been reached, method 700b proceeds to operation 716.

At operation 716, the processor descends along the gradient. In embodiments, once the processor descends along the gradient, method 700b returns to operation 710.

Figure 7C:
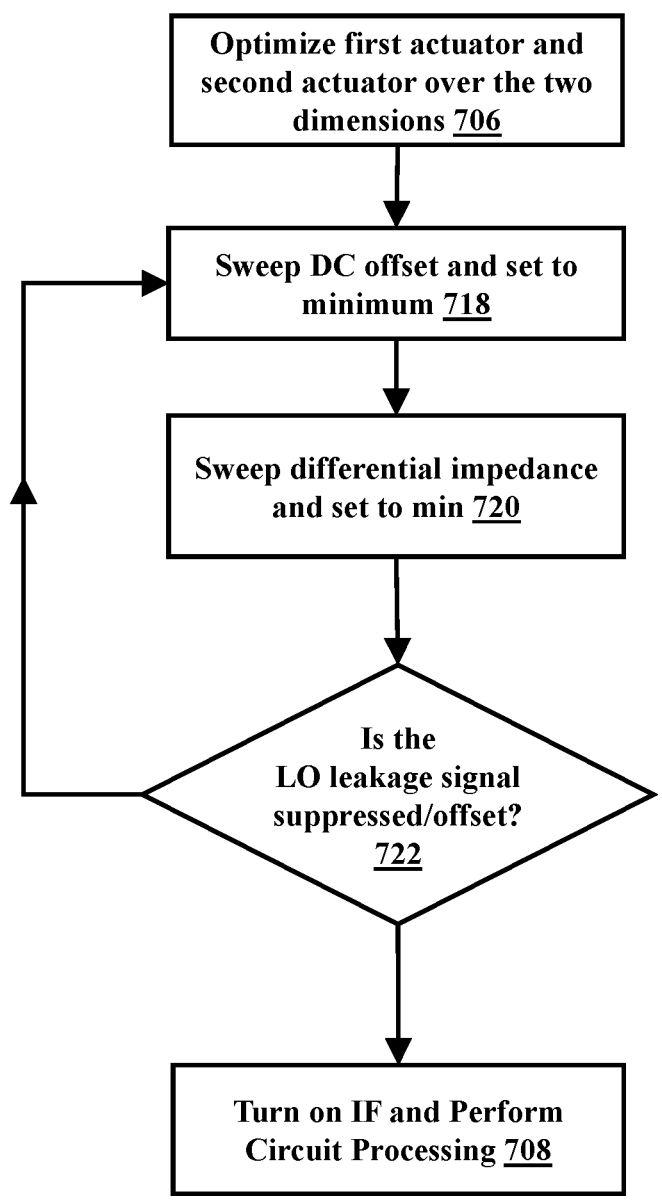
FIG. 7C is a flowchart of an exemplary method for optimizing LO leakage suppression, in accordance with embodiments of the present disclosure.

Turning to FIG. 7C, depicted is a flowchart diagram 700 demonstrating a continuation of optimization method 700, particularly operation 706, depicting a method optimizing the calibration signal/adjustments associated with first actuator 308 and/or second actuator 310 in order to suppress/reduce LO leakage in a frequency conversion system (e.g., frequency conversion system 600), in accordance with embodiments of the present disclosure. In embodiments, method 700c may be configured by optimization module 608 to determine the optimization one dimension at a time (e.g., first actuator 308 and then, if needed, second actuator 310).

In some embodiments, a processor of a system may perform the operations of the method 700c. In some embodiments, method 700c begins as a sub-component of operation 706 while in other embodiments, the following operations (e.g., operations 718, 720, and 722) are independent operations occurring separate an/or after operation 706 At operation 718, the processor may perform a DC offset sweep to determine a minimum. While in embodiments, the minima may be identified when the DC offset sweep is equal to zero, in other embodiments, the minima may be a threshold value that once reached, may be rounded down to zero. Alternatively, a processor may utilize a gradient descent, a binary search algorithm, or a brute force search. In embodiments, the DC offset sweep may be used to determine the calibration signal (e.g., first basis vector) associated with first actuator 308. In some embodiments, method 700c proceeds to operation 720. At operation 720, the processor may perform a differential impedance sweep and determine the minimum. In embodiments, the differential impedance sweep may be used to determine the calibration signal (e.g., second basis vector) associated with second actuator 310. In some embodiments, the minimum may be determined using a brute force search, where all possible values are attempted. In some embodiments, method 700c proceeds to operation 722. At operation 722 the processor determines if the LO leakage signal (e.g., first leakage basis vector and second leakage basis vector) is sufficiently suppressed or offset (e.g., by first basis vector and second basis vector). Convergence may occur when the minimum values of the first actuator and/or second actuator sweeps are not changed. Alternatively, convergence may also occur when the amplitude level of the LO is sufficiently low. In embodiments where it is determined there is convergence, method 700c proceeds to operation 708. In embodiments where there is not enough coverage, method 700c returns to operation 718.

As discussed in more detail herein, it is contemplated that some or all of the operations of the methods 700, 700b, and 700c may be performed in alternative orders or may not be performed at all; furthermore, multiple operations may occur at the same time or as an internal part of a larger process.

Figure 8:
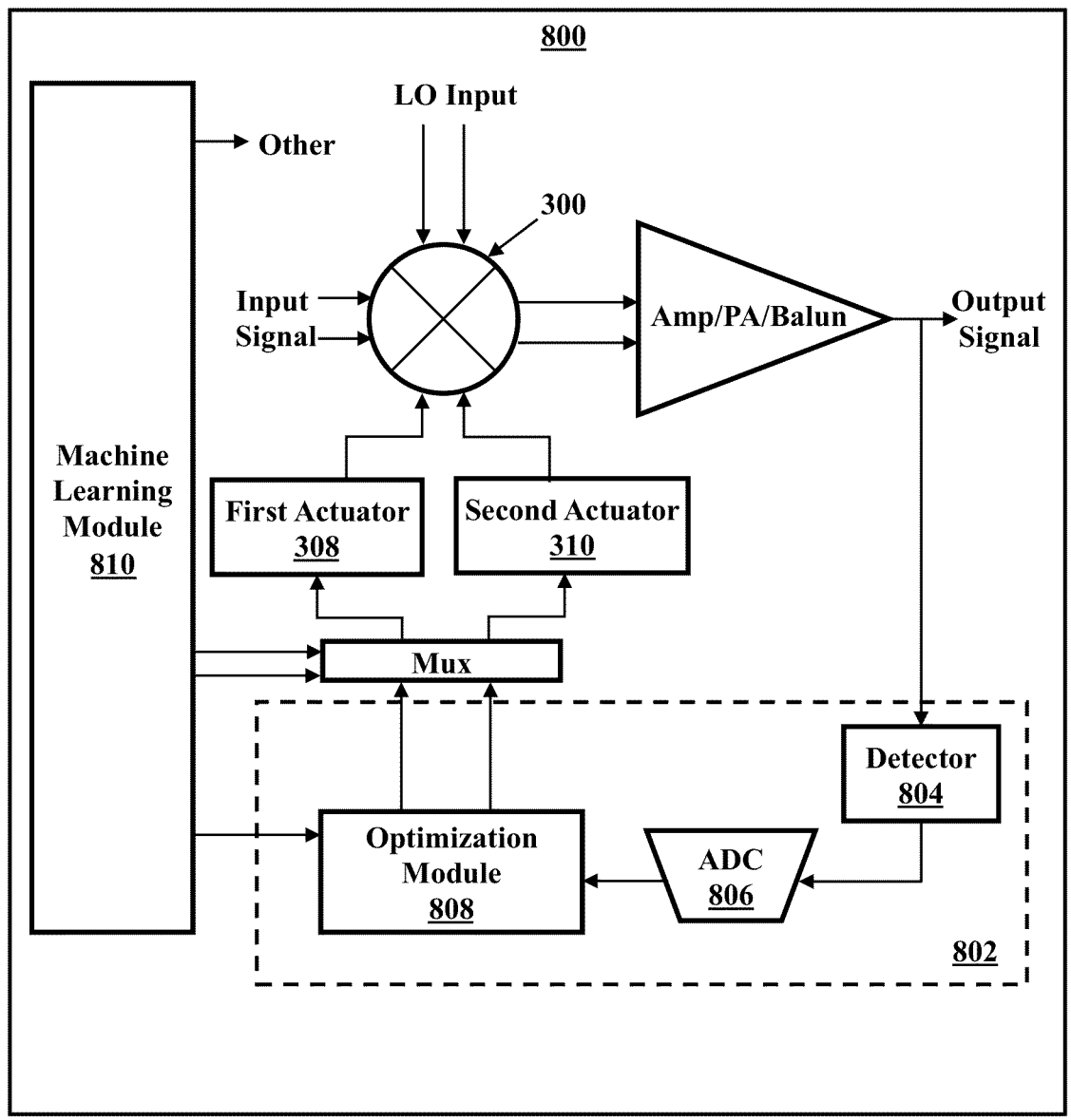
FIG. 8 depicts a schematic view of a frequency conversion circuit system, in accordance with embodiments of the present disclosure.

Referring now to FIG. 8, depicts an exemplary frequency conversion system 800 configured to suppress/reduce LO leakage in an output signal using machine learning techniques, in accordance with embodiments of the present disclosure. In some embodiments, structures in frequency conversion system 800 may be similarly configured to those components having similar names. However, in other embodiments, such components may have additional or different features when specifically referenced in frequency conversion system 800 than when referenced in regard to frequency conversion system 600.

In embodiments, frequency conversion system 800 can be configured to have calibration module 802. Calibration module 802 may be configured as part of the frequency conversion circuit 300 or may be configured independent of the frequency conversion circuit. Calibration module 802 may be electrically coupled to receive the first leakage basis vector and/or the second leakage basis vector of the LO leakage signal (e.g., measured by the detector). In these embodiments, calibration module 802 may be electrically coupled in such a manner to enable calibration of the first actuator and the second actuator. Such calibration may be used to offset the first leakage basis vector and the second leakage basis vector.

Calibration module 802 may include, but is not limited to, detector 804, analog to digital converter (ADC) 806, and/or optimization algorithm module 808 (see also optimization algorithm 706). Detector 804 can receive the output signal resulting from frequency conversion circuit 300. While in some embodiments, detector 804 receives the output signal directly from frequency conversion circuit 300, in other embodiments, the output signal arising from frequency conversion circuit 300 may be further modified with the use an amplifier, balun, or any other device before being received by detector 804. Information observed in the output signal by detector 804 may then be converted from a digital signal to an analog signal (e.g., via ADC 806), if necessary. Information observed in the output signal by detector 804 may then be received by optimization algorithm module 808. In embodiments, frequency conversion system 800 may also include machine learning module 810.

Machine learning module 810 may be configured to receive additional information. This additional information may include, but is not limited to, historical data received from detector 804, historical data associated with optimizing and calibrating first actuator 308 and second actuator 310, various input variables collected from other sensors within the circuit or device, and/or any combination thereof. These input variables may be received by any combination of the following sensors: voltage sensors, temperature sensors, LO input power sensor, input signal power sensor (e.g., IF/RF input signals), and output power sensor (e.g., detector 804). In embodiments, machine learning module 810 can utilize and configure the relevant historical data to determine more precisely/accurately how, when and if first actuator 308 and/or second actuator 310 should be calibrated or optimized in order to perform LO leakage suppression in the output signal. In these embodiments, machine learning module 810 can provide optimization algorithm 808 with the relevant information necessary to allow optimization algorithm 808 to quickly calculate the necessary information required calibrate/optimize the particular actuators. In some embodiments, machine learning module 810 can also be configured to control or maintain other actuators on the chip. For example, machine learning module 810 could control particular settings for different parts of the frequency conversion system. (e.g., the LO input buffer, the mixer, amplifier/PA, etc.).

Figure 9:
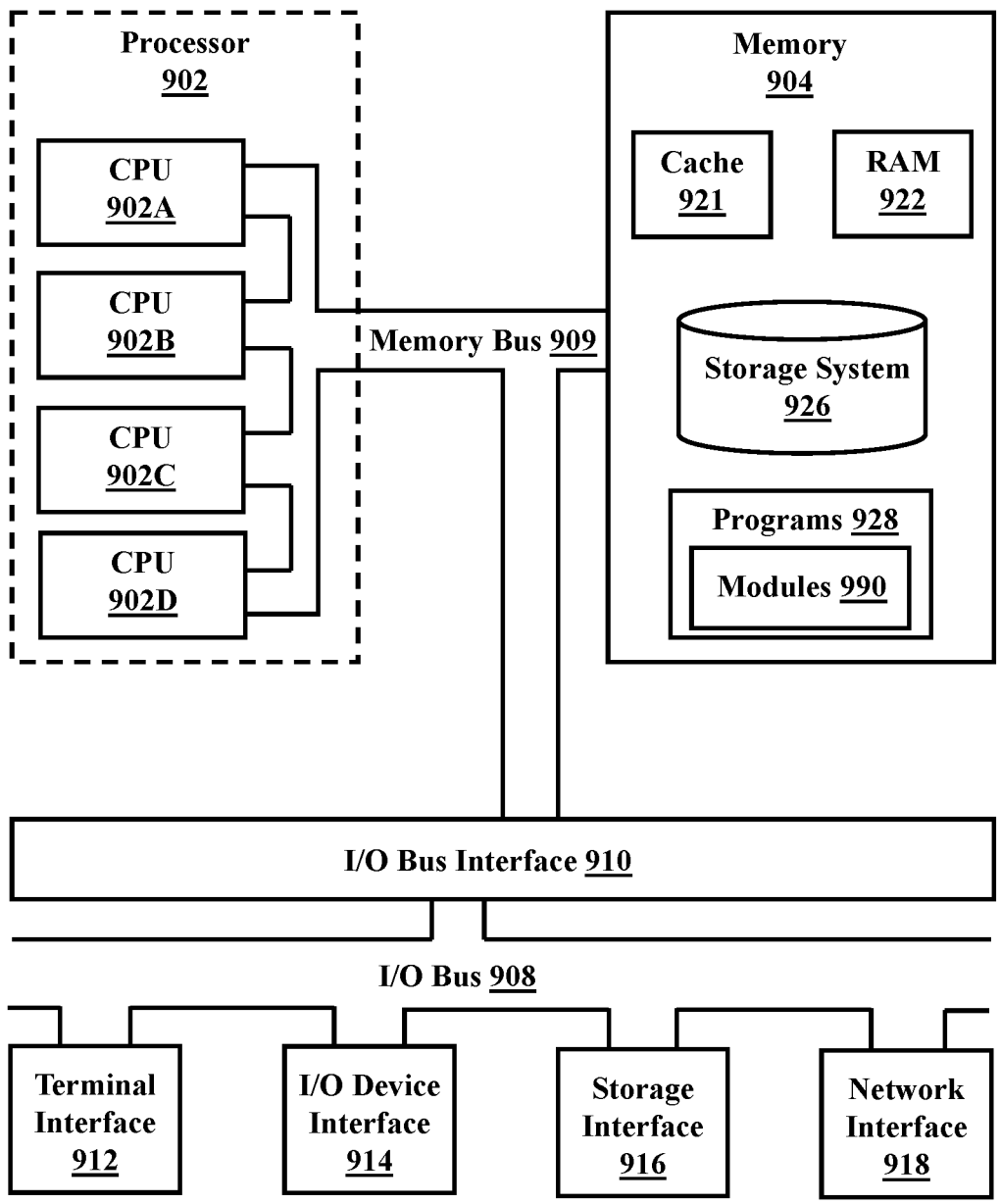
FIG. 9 illustrates a high-level block diagram of an example computer system that may be used in implementing one or more of the methods, tools, and modules, and any related functions, described herein, in accordance with embodiments of the present disclosure.

FIG. 9, illustrated is a high-level block diagram of an example computer system 901 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 901 may comprise one or more CPUs 902, a memory subsystem 904, a terminal interface 912, a storage interface 916, an I/O (Input/Output) device interface 914, and a network interface 918, all of which may be communicatively coupled, directly or indirectly, for inter-component communication via a memory bus 909, an I/O bus 908, and an I/O bus interface unit 910.

The computer system 901 may contain one or more general-purpose programmable central processing units (CPUs) 902A, 902B, 902C, and 902D, herein generically referred to as the CPU 902. In some embodiments, the computer system 901 may contain multiple processors typical of a relatively large system; however, in other embodiments the computer system 901 may alternatively be a single CPU system. Each CPU 902 may execute instructions stored in the memory subsystem 904 and may include one or more levels of on-board cache.

System memory 904 may include computer system readable media in the form of volatile memory, such as random access memory (RAM) 922 or cache memory 924. Computer system 901 may further include other removable/non-removable, volatile/non-volatile computer system storage media. By way of example only, storage system 926 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 904 can include flash memory, e.g., a flash memory stick drive or a flash drive. Memory devices can be connected to memory bus 909 by one or more data media interfaces. The memory 904 may include at least one program product having a set (e.g., at least one) of program modules that are configured to carry out the functions of various embodiments.

One or more programs/utilities 928, each having at least one set of program modules 990 may be stored in memory 904. The programs/utilities 928 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 928 and/or program modules 990 generally perform the functions or methodologies of various embodiments.

Although the memory bus 909 is shown in FIG. 9 as a single bus structure providing a direct communication path among the CPUs 902, the memory subsystem 904, and the I/O bus interface 910, the memory bus 909 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 910 and the I/O bus 908 are shown as single respective units, the computer system 901 may, in some embodiments, contain multiple I/O bus interface units 910, multiple I/O buses 908, or both. Further, while multiple I/O interface units are shown, which separate the I/O bus 908 from various communications paths running to the various I/O devices, in other embodiments some or all of the I/O devices may be connected directly to one or more system I/O buses.

In some embodiments, the computer system 901 may be a multi-user mainframe computer system, a single-user system, or a server computer or similar device that has little or no direct user interface, but receives requests from other computer systems (clients). Further, in some embodiments, the computer system 901 may be implemented as a desktop computer, portable computer, laptop or notebook computer, tablet computer, pocket computer, telephone, smartphone, network switches or routers, or any other appropriate type of electronic device.

It is noted that FIG. 9 is intended to depict the representative major components of an exemplary computer system 901. In some embodiments, however, individual components may have greater or lesser complexity than as represented in FIG. 9, components other than or in addition to those shown in FIG. 9 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A frequency conversion circuit configured to suppress a local oscillator (LO) leakage signal having a first leakage basis vector and a second leakage basis vector, the frequency conversion circuit comprising:
    a first actuator electrically coupled to a differential signal input associated with a transconductance stage of the frequency conversion circuit, wherein the first actuator is configured to adjust a first basis vector associated with a differential output of the transconductance stage to, at least partially, offset the first leakage basis vector of the LO leakage signal; and
    a second actuator electrically coupled to the differential current output of the transconductance stage and electrically coupled to a set of commutating devices of the frequency conversion circuit, the commutating devices configured to receive differential LO inputs, wherein the second actuator is configured to adjust a second basis vector associated with a differential impedance of the set of commutating devices to, at least partially, offset the second leakage basis vector of the LO leakage signal.

2. The frequency conversion circuit of claim 1, wherein the second actuator includes a variable reactive component at each of the differential outputs of the transconductance stage.

3. The frequency conversion circuit of claim 2, wherein the variable reactive component is configured to provide degeneration impedance to the set of commutating devices.

4. The frequency conversion circuit of claim 1, further comprising a calibration module, wherein the calibration module is configured to calibrate the first actuator and the second actuator.

5. The frequency conversion circuit of claim 4, wherein the calibration module includes an optimization module to calibrate the first actuator and the second actuator.

6. The frequency conversion circuit of claim 4, wherein the calibration module includes a machine learning module configured to calibrate the first actuator and the second actuator.

7. The frequency conversion circuit of claim 4, further including a detector, wherein the detector, configured to receive the LO leakage signal, is electrically coupled to the calibration module.

8. A method of suppressing a local oscillator (LO) leakage signal having a first leakage basis vector and a second leakage basis vector in a frequency conversion circuit, the method comprising:
    calibrating a first actuator electrically coupled to a differential signal input associated with a transconductance stage of the frequency conversion circuit, wherein calibrating a first actuator adjusts a first basis vector associated with a differential output of the transconductance stage;

calibrating a second actuator electrically coupled to receive the differential current output of the transconductance stage and electrically coupled to a set of commutating devices of the frequency conversion circuit, the commutating devices configured to receive differential LO inputs, wherein calibrating a second actuator adjusts a second basis vector associated with a differential impedance of the set of commutating devices; and offsetting at least partially, responsive to adjusting the first basis vector and the second basis vector, the first leakage basis vector and second leakage basis vector of the LO leakage signal.

9. The method of claim 8, wherein offsetting at least partially, the first leakage basis vector and second leakage basis vector of the LO leakage signal includes:

suppress, at least partially, the LO leakage signal from an output of the frequency conversion circuit.

10. The method of claim 8, further comprising:

determining the first leakage basis vector and the second leakage basis vector of the LO leakage signal associated with the frequency conversion circuit.

11. The method of claim 10, wherein determining the first leakage basis vector and second leakage basis vector of the LO leakage signal of the frequency conversion circuit includes:

turning off the differential signal input;
identifying the first leakage basis vector and second leakage basis vector of the LO leakage signal;
determining an optimized calibration for each the first basis vector and the second basis vector; and
turning on the differential signal input and activate the frequency conversion circuit.

12. The method of claim 11, wherein determining the optimized calibration for each the first basis vector and the second basis vector further includes:

setting adjacent calibration codes;
computing a gradient descent associated with the first basis vector and the second basis vector; and
determining a minima of the gradient descent.

13. The method of claim 12, further including:
analyzing the minima of the gradient descent;
determining if the minima of the gradient descent provides optimized calibration for each the first basis vector and the second basis vector; and
recomputing, responsive to determining the minima of the gradient descent does not provide optimized calibration, the gradient decent.

14. The method of claim 11, wherein determining the optimized calibration for the first basis vector and the second basis vector further includes:

performing a differential direct current (DC) sweep;
identifying, based at least in part on the differential DC sweep, a differential DC minima offset of the first leakage basis vector;
performing a differential impedance sweep; and
identifying, based at least in part on the differential impedance sweep, a differential impedance minima offset of the second leakage basis vector.

15. The method of claim 14, further including:
analyzing the differential DC minima offset of the differential DC sweep and the differential impedance minima offset of the differential impedance sweep;

determining if the differential DC minima offset and the differential impedance minima offset provides optimized calibration for the first basis vector and the second basis vector to suppress, at least partially, the LO leakage signal; and recomputing, responsive to determining the minima of the gradient descent does not provide optimized calibration, the differential DC sweep and the differential impedance minima offset.

16. A system for suppressing a local oscillator (LO) leakage signal, having a first leakage basis vector and a second leakage basis vector, in a mixed output of a frequency conversion circuit, the system comprising:

a frequency conversion circuit configured to receive a differential signal input and a differential LO input, wherein the frequency conversion circuit configures the differential signal input and the differential LO input to generate the mixed output having a LO leakage signal and a desired signal, the frequency conversion circuit further comprising:

a first actuator configured within the frequency conversion circuit, wherein the first actuator is configured to adjust a first basis vector of the frequency conversion circuit, to, at least partially, offset the first leakage basis vector of the LO leakage signal; and a second actuator configured within the frequency conversion circuit, wherein the second actuator is configured to adjust a second basis vector of the frequency conversion circuit to, at least partially, offset the second leakage basis vector of the LO leakage signal;

a detector coupled to measure the first leakage basis vector and the second leakage basis vector of the frequency conversion circuit; and a calibration module electrically coupled to receive the first leakage basis vector and the second leakage basis vector of the LO leakage signal measured by the detector, wherein the calibration module is electrically coupled to calibrate the first actuator and the second actuator to offset the first leakage basis vector and the second leakage basis vector, respectively.

17. The system of claim 16, wherein the calibration module includes an optimization module configured to determine an optimized calibration for each the first actuator and the second actuator.

18. The system of claim 16, wherein the calibration module further comprises a machine learning module configured to determine an optimized calibration for each the first actuator and the second actuator.

19. The system of claim 16, wherein the detector is configured to detect one or more circuit parameters.

20. The system of claim 19, wherein the calibration module is configured to receive one or more circuit parameters from the detector.

21. A system for suppressing a local oscillator (LO) leakage signal, having a first leakage basis vector and a second leakage basis vector, in a mixed output of a frequency conversion circuit, the system comprising:

a frequency conversion circuit configured to receive a differential signal input and a differential LO input, wherein the frequency conversion circuit configures the differential signal input and the differential LO input to generate the mixed output having a LO leakage signal and a desired signal, the frequency conversion circuit further comprising:

a first actuator configured within the frequency conversion circuit, wherein the first actuator is configured to adjust a first basis vector of the frequency conversion circuit, to, at least partially, offset the first leakage basis vector of the LO leakage signal;

a second actuator configured within the frequency conversion circuit, wherein the second actuator is configured to adjust a second basis vector of the frequency conversion circuit to, at least partially, offset the second leakage basis vector of the LO leakage signal; and a calibration module electrically coupled to receive the first leakage basis vector and the second leakage basis vector of the LO leakage signal, wherein the calibration module is electrically coupled to calibrate the first actuator and the second actuator to offset the first leakage basis vector and the second leakage basis vector, respectively.

22. The system of claim 21, wherein the calibration module includes an optimization module configured to determine an optimized calibration for each the first actuator and the second actuator.

23. The system of claim 21, wherein the calibration module further comprises a machine learning module configured to determine an optimized calibration for each the first actuator and the second actuator.

* * * * *